(12) United States Patent
Kouvetakis et al.

(10) Patent No.: US 8,216,537 B2
(45) Date of Patent: Jul. 10, 2012

(54) SILICON-GERMANIUM HYDRIDES AND METHODS FOR MAKING AND USING SAME

(75) Inventors: John Kouvetakis, Mesa, AZ (US); Cole J. Ritter, III, Palmer Township, PA (US); Changwu Hu, Gilbert, AZ (US); Ignatius S. T. Tsong, Scottsdale, AZ (US); Andrew Chizmeshya, Chandler, AZ (US)

(73) Assignee: Arizona Board of Regents, Scottsdale, AZ (US)

( * ) Notice: Subject to any disclaimer, the term of this patent is extended or adjusted under 35 U.S.C. 154(b) by 556 days.

(21) Appl. No.: 12/093,279

(22) PCT Filed: Nov. 21, 2006

(86) PCT No.: PCT/US2006/045091
§ 371 (c)(1),
(2), (4) Date: Sep. 3, 2009

(87) PCT Pub. No.: WO2007/062056
PCT Pub. Date: May 31, 2007

(65) Prior Publication Data
US 2010/0012972 A1    Jan. 21, 2010

Related U.S. Application Data

(60) Provisional application No. 60/739,528, filed on Nov. 23, 2005, provisional application No. 60/764,128, filed on Feb. 1, 2006.

(51) Int. Cl.
*C01B 33/00* (2006.01)
*C30B 25/02* (2006.01)

(52) U.S. Cl. 423/324; 117/88; 252/521.3; 257/E21.102; 438/503; 438/507

(58) Field of Classification Search .................. 257/19, 257/616, E21.102; 423/324, 347; 438/503, 438/507; 252/519.31, 521.3; 117/88
See application file for complete search history.

(56) References Cited

U.S. PATENT DOCUMENTS

| 2,988,427 | A | 6/1961 | Jenker et al. |
| 4,777,023 | A | 10/1988 | Fieselmann et al. |
| 4,910,153 | A | 3/1990 | Dicksen et al. |
| 7,645,339 | B2 | 1/2010 | Singh et al. |
| 2004/0040493 | A1* | 3/2004 | Vineis et al. .................. 117/89 |
| 2006/0115934 | A1* | 6/2006 | Kim et al. ...................... 438/149 |

(Continued)

FOREIGN PATENT DOCUMENTS

DE    4306106    2/1993

(Continued)

OTHER PUBLICATIONS

Linder, K.K., et al. "Reduction of Dislocation Density in Mismatched SiGe/Si Using a Low-Temperature Si Buffer Layer." Appl. Phys. Lett., vol. 70, No. 24 (Jun. 16, 1997): pp. 3224-3226.*

(Continued)

*Primary Examiner* — Matthew W Such
(74) *Attorney, Agent, or Firm* — McDonnell Boehnen Hulbert & Berghoff LLP

(57) ABSTRACT

The present invention provides novel silicon-germanium hydride compounds, methods for their synthesis, methods for their deposition, and semiconductor structures made using the novel compounds.

58 Claims, 16 Drawing Sheets

U.S. PATENT DOCUMENTS

| | | |
|---|---|---|
| 2007/0297967 A1 | 12/2007 | Kouvetakis et al. |
| 2008/0113186 A1 | 5/2008 | Kouvetakis et al. |
| 2009/0050935 A1 | 2/2009 | Kouvetakis et al. |

FOREIGN PATENT DOCUMENTS

| | | |
|---|---|---|
| DE | 4306106 A1 | 9/1994 |
| WO | 2006/031240 A1 | 3/2006 |
| WO | 2006/031257 A2 | 3/2006 |

OTHER PUBLICATIONS

Timms, P.L., et al. "The Silicon-Germanium Hydrides." J. Chem. Soc. (Apr. 1964): pp. 1467-1475.*
Chizmeshya, et al., J. Am. Chem. Soc. 2006, 128 (21), 6919-6930.
Gersten, et al., The Physics and Chemistry of Materials, John Wiley & Sons; New York, 2001, pp. 96-100.
Dutton, et al., Inorganic Chemistry, 1968, 7(9), pp. 1735-1739.
Lobreyer, T., Chem Ber, 1991, 124(11), 2405-2410.
Mackay, K.M., et al, J. Chem Soc, 1969, A, 2938.
Mooney, P. M.; et al. Annu. Rev. Mater. Sci. 2000, 30, 335.
Tromp, R. M.; et al. Annu. Rev. Mater. Sci. 2000, 30, 431.
Brunner, K., et al., Rep. Prog. Phys. 2002, 65(1), 27-72.
Kuo, Y-H; et al. Nature 2005, 437, 1334.
Bean, J, C; et al. J. Vac Sci. Technol. 1984, A 2(2), 436-440.
Greve, D.W., Mat. Sci. Eng., 1993, B18(1), 22-51.
Konig, U., et al., IEEE Electron Device Lett, 1993, 14(4), 205-207.
M. L. Lee, J. Appl. Phys. 2003, 94, 2590-2596.
R. Hamond, Electron. Lett. 1999, 35(18), 1590-1591.
Y. J. Mii, Appl. Phys. Lett., 1991, 59(13), 1611-1613.
P. M. Mooney, Appl. Phys. Lett., 1995, 67(16), 2373-2375.
K. K. Linder, Appl. Phys Lett., 1997, 70(24), 3224-3226.
C. S. Peng, Appl. Phys. Lett., 1998, 72(24), 3160-3162.
Lee, M. L.; et al. J. Vac. Sci.Technol. 2004, B 22 (1), 158.
E. Kasper, et al., Appl Surf. Sci. 2004, 224, 3.
Currie, M. T.; et al. Appl. Phys. Lett. 1998, 72 (14), 1718.
G. Eres, et al., J. Vac. Sci. Technol., 1993, A11(5), 2463-2471.
T. R. Bramblett, et al. J. Appl. Phys., 1995, 77(4), 1504-1513.
J. Takahashi, et al., Appl. Phys. Lett., 1991, 58(24), 2776-2778.
Ritter, C.J.; et al. J. of the Am. Chem. Soc., 2005, 127(27), 9855-9864.
Hu, C.-W.; et al. Applied Physics Letters, 2005, 87(18), 181903/1-3.
Nijhawan, S.; et al. J. Aerosol Science 2003, 34, 691-711.
Soldner, M.; et al. J. Organometallic Chem. 1996, 521, 295.
Urban, J.; et al J. Chem. Phys. Lett. 1997, 264, 441-448.
Albinsson, B.; et al J. Phys. Chem. 1996, 100, 8681.
Jasinski, J. M.; et al. Chem. Rev. 1995, 95, 1203.
Cullis, A.G.; et al. J. Cryst. Growth 1992, 123, 333.
Phillips, et al., Anal. Chem. 1963, 35(4): 505-510.
Phillips, et al., Z. Analyt. Chem. 1963, 197: 202-211.
Hu, et al. (2005) Applied Physics Letters, 87(8): 83101.
Ritter, C.J., et al., "Synthesis and Fundamental Studies of (H3Ge)xSiH4-x Molecules: Precursors to Semiconductor Hetero- and Nanostructures on Si", Journal of the American Chemical Society, Jun. 16, 2005, 127:9855-9864.
Hu, Changwu, et al., "Synthesis of highly coherent SiGe and Si4Ge nanostructures by molecular beam epitaxy of H3SiGeH3 and Ge(SiH3)4", Chemistry of Materials, Sep. 23, 2003, 15(19):3569-3572.
Lobreyer, T., et al., "Synthesis and Structure of Tetrasilylgermane, Ge(SiH3)4, and Other Silylgermanes", Angew. Chem. Int. Ed. Engl., 1993, 32(4):586-587.
Hu, et al. (2003) Chemistry of Materials: American Chemical Society, 15(19):3569-3572.
Bauer, et al. (2003) Applied Physics Letters, 83(11): 2163-2165.
Wolf, et al. (1986) Processing for the VLSI ERA. vol. 1: Process Technology; Lattice Press; Sunset Beach, CA; Chapter 6, pp. 161-197.
Gaiduk, et al. (2000) Thin Solid Films, 367 (1-2): 120-125.
Supplemental ISR EP 05746524, mailed Jan. 31, 2011.

* cited by examiner

| | n-GeSiSiGe | g-GeSiSiGe | i-GeSiGeGe | n-GeSiGeGe | g-GeSiGeGe |
|---|---|---|---|---|---|
| Bond lengths | | | | | |
| Si-Si | 2.350 | 2.352 | 2.351 | | |
| Si-Ge | 2.398 | 2.397 | 2.400 | 2.398 | 2.396, 2.400 |
| Ge-Ge | | | | 2.446 | 2.446 |
| Si-H | 1.485 | 1.486 | 1.488, 1.483 | 1.485 | 1.485 |
| Ge-H | 1.539 | 1.538 | 1.539 | 1.548, 1.542 | 1.548, 1.542 |
| Bond angles | | | | | |
| Ge-Si-Ge | | | 110.7 | 112.7 | 112.8 |
| Si-Ge-Ge | | | | 112.8 | 113.4 |
| Ge-Si-Si | 112.6 | 112.8 | 111.2 | | |
| H-Si-H | 107.7 | 107.7 | 108.6 | | |
| H-Ge-H | 108.3 | 108.2 | 108.3 | 107.7 | 107.8 |
| H-Si-Ge | 108.9 | 108.8 | 107.7 | | |
| H-Ge-Si | 110.5, 110.5, 111.0 | 110.7 | | 109.0, 109.2 | 109.0 |
| H-Ge-Ge | | | | 109.5, 110.5, 111.1 | 109.3, 110.7 |
| H-Si-Si | | | 108.4 | | |
| Bond Torsions | | | | | |
| Ge-Si-Si-Ge | 180.0 | 66.0 | -33.1 | | |
| Ge-Si-Ge-Ge | | | | 180.0 | 64.1 |
| H-Ge-Ge-H | | | | 58.2, 62.0, 178.4 | 58.4, 61.7, 178.5 |
| H-Ge-Si-H | 58.6, 61.5, 178.8 | 58.5, 61.9, 178.9 | 53.1, 72.6, 179.7 | 58.8, 61.4, 179.0 | 59.9, 60.1, 179.8 |
| H-Ge-Si-Ge | | | 57.6, 62.2, 177.8 | 59.8, 59.8, 180.0 | 58.7, 61.2, 178.8 |
| H-Ge-Ge-Ge | | | 30.2 | ±58.6 | 57.0, 174.5 |
| H-Si-Ge-Ge | | | | | |
| H-Ge-Si-Si | 58.6, 61.5, 180.0 | 59.5, 60.4, 179.7 | 58.2, 61.8, 178.3 | | |
| Energetics | | | | | |
| $E_0$ | -4739.094740 | -4739.093652 | -4739.094943 | -6526.593697 | -6526.593140 |
| $E_0+E_{ZPE}$ | -4739.013922 | -4739.013009 | -4739.014382 | -6526.514649 | -6526.513945 |
| $E_0+E_{tot}$ | -4739.003483 | -4739.002561 | -4739.003703 | -6526.503627 | -6526.503131 |
| $E_0+H_{corr}$ | -4739.002539 | -4739.001616 | -4739.002759 | -6526.502683 | -6526.502186 |
| $E_0+G_{corr}$ | -4739.051456 | -4739.050695 | -4739.052539 | -6526.555562 | -6526.553533 |

*Figure 12*

SILICON-GERMANIUM HYDRIDES AND METHODS FOR MAKING AND USING SAME

CROSS REFERENCE

This application claims priority to U.S. Provisional Patent Application Ser. No. 60/739,528 filed Nov. 23, 2005 and Ser. No. 60/764,128 filed Feb. 1, 2006, both of which are hereby incorporated by reference in its entirety.

STATEMENT OF GOVERNMENT INTEREST

This work was supported by National Science Foundation grant DMR-0221993 thus the U.S. government may have certain rights in the invention.

FIELD OF THE INVENTION

The present application relates generally to the fields of chemistry, optoelectronics, silicon-germanium alloys, semiconductor structures, and related methods and devices.

BACKGROUND

Heteroepitaxial $Ge_{1-x}Si_x$ layers on Si(100) with high Ge contents are of interest due to many applications in key technologies such as solar cells, MEMS, quantum cascade lasers and Si-based photonics[1,2] including high speed modulators and photodetectors.[3] However, these materials are much less developed in spite of this high impact potential in IR optical devices. In addition, they serve as virtual substrates for growth of high mobility, strained Si and Ge device channels, and are also considered as a potential pathway to monolithic integration of III-V based devices with Si technologies.[4,5] The best current route to these materials is complicated and fraught with difficulties, requiring both high temperature growth of thick (>10 μm) compositionally graded films and a chemical-mechanical planarization step to relieve the misfit strain between the $Ge_{1-x}Si_x$ epilayer and Si substrate and produce a flat surface, respectively.[6]

To circumvent these difficulties we have recently developed new chemical vapor deposition (CVD) heteroepitaxy to produce device quality strain-relieved Ge-rich films on Si without the need for graded compositions.[7,8] Our strategy involves depositions of single source hydride precursors with direct Si—Ge bonds such as the $(H_3Ge)_xSiH_{4-x}$ (x=1-4) family of compounds. These are routinely synthesized with semiconductor grade purity via straightforward methodologies utilizing commercially available starting materials.[7] Their physical and chemical properties such as high volatility and facile reactivity make them particularly useful as reagents in low temperature film growth by CVD and gas source molecular beam epitaxy (GSMBE). Our initial growth experiments have yielded single crystal films with compositions $Si_{0.50}Ge_{0.50}$, $Si_{0.33}Ge_{0.67}$, $Si_{0.25}Ge_{0.75}$ and $Si_{0.20}Ge_{0.80}$, precisely matching those of the corresponding precursors $SiH_3GeH_3$, $(H_3Ge)_2SiH_2$, $(H_3Ge)_3SiH$ and $(H_3Ge)_4Si$.[8] Our results demonstrate that exact control of the composition, structure and strain at the atomic level can be achieved via incorporation of the entire Si—Ge framework of the precursors into the film. The resulting films are of much higher quality than those previously reported using conventional sources and grow at much lower temperatures that are compatible with CMOS technology.

Within this compositional range the $Si_{0.50}Ge_{0.50}$ semiconductor system is of particular importance because it possesses the ideal lattice dimensions to integrate fully strained Si channels exhibiting high electron mobilities into metal oxide silicon field effect transistors (MOSFETS). Thus these materials are ideally suited for immediate technological applications in high-speed devices. However, in our experiments we have observed that stoichiometric $Si_{0.50}Ge_{0.50}$, with the required device quality properties (surface planarity, low defect densities), can only be grown near a maximum temperature of ~450° C. at a growth rate of only 0.2 nm/min which is too low to be practical for high throughput device fabrication. Negligible film growth was observed at lower temperatures via $H_3GeSiH_3$, while films with rough surfaces and high dislocation densities were obtained above ~500° C. due to the thermal mismatch with the substrate.

The synthesis of new compounds with increased reactivities and improved properties for device fabrication relative to $H_3GeSiH_3$ would be of great value in the art.

In this study we synthesize and fully characterize the butane-like $(GeH_3)_2(SiH_2)_2$ (1) compound containing highly reactive —$H_2Si$—$SiH_2$— functionalities (rather than $SiH_3$). The $H_2Si$=$SiH_2$ dimeric unit has been identified as the dominant reactive intermediate in high temperature CVD via decomposition of conventional Si-hydrides. These species lead to highly efficient growth of homoepitaxial Si.[9] Precursor (1) is specifically designed to incorporate these necessary —$H_2Si$—$SiH_2$— building blocks and provide a new low temperature route for development of a broad range of Si-containing materials. Here we demonstrate the utility of (1) to produce device quality $Si_{0.50}Ge_{0.50}$ alloys at unprecedented low temperatures of 350° C. A 10-fold improvement in the growth rate (~2.0 nm/min) is achieved at 350° C. relative to growth (0.2 nm/minute) at 450° C. via $SiH_3GeH_3$ leading to uniformly stressed or strain-relaxed thin films directly on Si with planar surfaces and remarkably reduced dislocation densities. En route to (1) we have produced the isobutane analog $(GeH_3)_2SiH(SiH_3)$ (2) and have also isolated and fully characterized the Ge-rich derivative $(GeH_3)_2(SiH_2GeH_2)$ (3). The latter is a moderately volatile liquid, with potential applications in low temperature synthesis of Ge-rich optoelectronic alloys.

SUMMARY OF THE INVENTION

In one aspect, the present invention provides compounds comprising a silicon-germanium hydride of formula I:

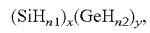

wherein x is 2, 3 or 4;
wherein y is 1, 2, or 3;
wherein x+y is 3, 4, or 5;
wherein n1 is independently 0, 1, 2, or 3 for each Si atom in the compound, to satisfy valency; and
wherein n2 is independently 0, 1, 2, or 3 for each Ge atom in the compound, to satisfy valency;
with the proviso that n2 is not 0 when y is 1;
with the further proviso that when x is 3 and y is 1, then n2 is 2 or 3; and
with the further proviso that when x is 2 and y is 1, then n2 is 3.

In a second aspect, the present invention provides semiconductor structures, comprising a substrate and an Si—Ge layer formed by introducing near the surface of a substrate a gaseous precursor comprising one or more compounds according to formula I.

In further aspect, the invention provides semiconductor structures, comprising a substrate and an Si—Ge layer comprising a backbone of one or more compounds according to formula I.

In a third aspect, the present invention provides methods for synthesizing one or more silicon-germanium hydrides of formula I, comprising combining a compound selected from the group consisting of a nonafluorobutane-sulfonic substituted disilane and a triflate substituted disilane, with a compound comprising a GeH$_3$ ligand under conditions whereby the silicon-germanium hydride is formed.

In a fourth aspect, the present invention provides methods for depositing a Si—Ge material on a substrate in a reaction chamber, comprising introducing into the chamber a gaseous precursor comprising one or more compounds according to formula I, under conditions whereby a layer comprising a Si—Ge material is formed on the substrate.

In a fifth aspect, the present invention provides methods for depositing an epitaxial Si—Ge layer on a substrate, comprising introducing at or near a surface of the substrate a gaseous precursor comprising one or more compounds of formula I, and dehydrogenating the precursor under conditions whereby epitaxial Si—Ge is formed on the substrate.

In a sixth aspect, the present invention provides a compound comprising $(SO_3C_4F_9)_2(SiH_2)_2$.

In a seventh aspect, the present invention provides methods for synthesizing $(SO_3C_4F_9)_2(SiH_2)_2$ comprising combining (p-tolyl)$_2$(SiH$_2$)$_2$ and HSO$_3$C$_4$F$_9$ under conditions whereby the $(SO_3C_4F_9)_2(SiH_2)_2$ is formed.

DESCRIPTION OF THE FIGURES

FIG. 12: Calculated thermochemical (300K) and structural properties of the conformational isomer pairs {n-GeSiSiGe, g-GeSiSiGe}, {n-GeSiGeGe, g-GeSiGeGe} and positional isomer i-Si(GeSiSi). The units for bond lengths, bond angles and energies are Angstroms, degrees and Hartree, respectively.

DETAILED DESCRIPTION OF THE INVENTION

Figure 1:
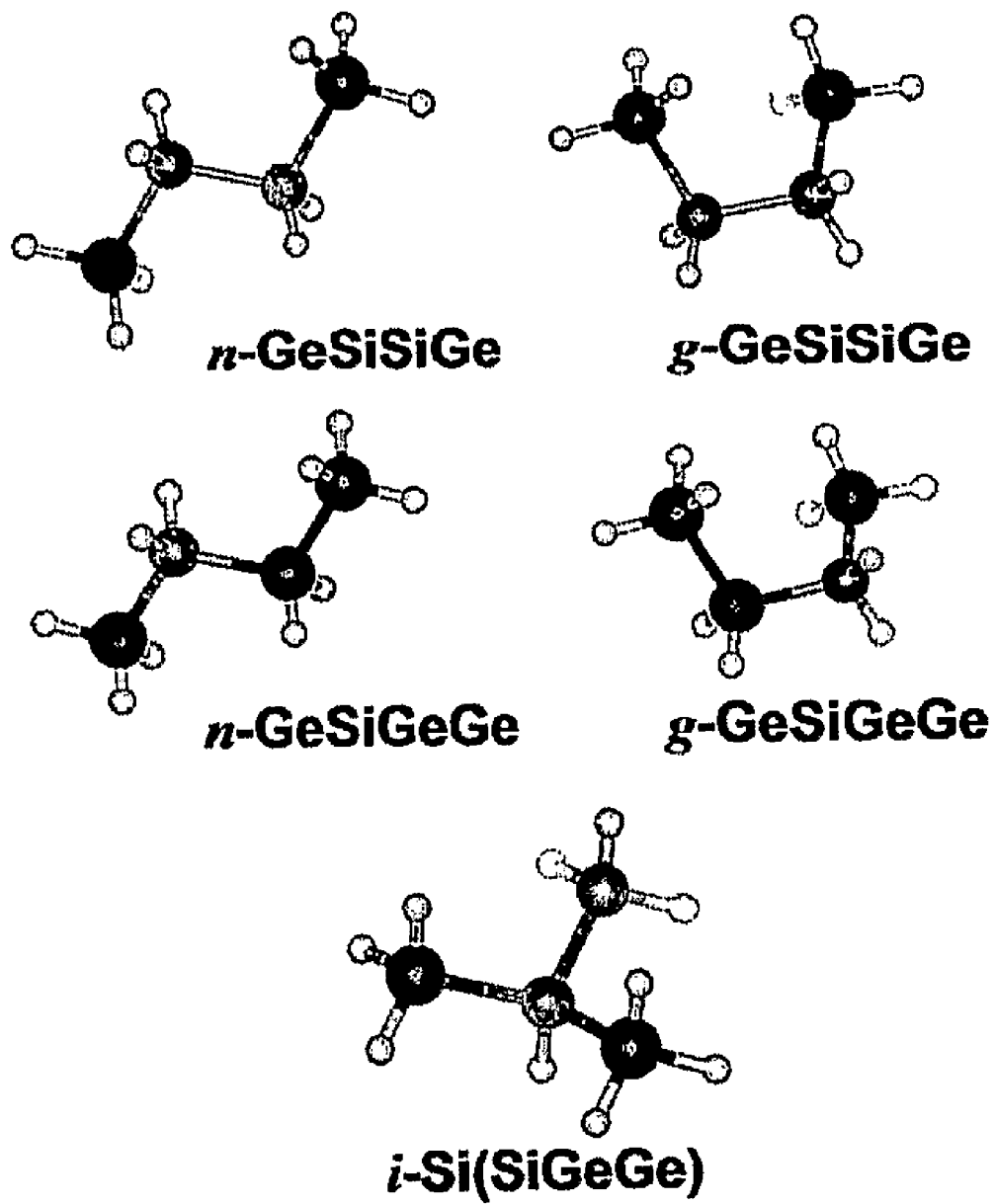
FIG. 1: Molecular structure of the conformational isomer pairs {n-GeSiSiGe, g-GeSiSiGe}, {n-GeSiGeGe, g-GeSiGeGe} and positional isomer i-Si(GeSiSi).

All publications, patents and patent applications cited herein are hereby expressly incorporated by reference for all purposes.

As used herein, the singular forms "a", "an" and "the" include plural referents unless the context clearly dictates otherwise.

In one aspect, the present invention provides compounds comprising or consisting of a silicon-germanium hydride of formula I:

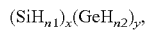

$(SiH_{n1})_x(GeH_{n2})_y$, wherein x is 2, 3 or 4;
wherein y is 1, 2, or 3;
wherein x+y is 3, 4, or 5;
wherein n1 is independently 0, 1, 2, or 3 for each Si atom in the compound, to satisfy valency; and
wherein n2 is independently 0, 1, 2, or 3 for each Ge atom in the compound, to satisfy valency;
with the proviso that n2 is not 0 when y is 1;
with the further proviso that when x is 3 and y is 1, then n2 is 2 or 3; and
with the further proviso that when x is 2 and y is 1, then n2 is 3.

As used herein, the phrase "to satisfy valency" means to maintain tetra-valency of each Si and Ge atom in the compounds of the invention.

As demonstrated herein, compounds according to formula I can be used, for example, in controlled depositions to produce stoichiometric SiGe films possessing desired properties for semiconductor applications including perfectly crystalline and epitaxial microstructures, smooth morphologies, and uniformly strain-relaxed states. The compounds of formula I are herein demonstrated to be remarkably stable over extended periods of time, and thus represent viable molecular sources for potential industrial applications.

Thus, in one embodiment of this first aspect, x is 2; in an alternative embodiment x is 3; in a further alternative embodiment x is 4. In embodiments where x is 2, y can be 1, 2, or 3 preferably 2 or 3, most preferably 2. In embodiments where x is 3, y can be 1 or 2, preferably 2. In embodiments where x is 4, y is 1.

In a further embodiment of this first aspect, x is 2 or 3, with the proviso that if y is 1, then n2 is 0, 1, or 2, and with the further proviso that if x is 2 and y is 2, then at least one of the following is true:
(i) n1 for at least one Si atom is 0, 1, or 2;
(ii) n2 for each Ge atom in the compound is 2; and
(iii) n2 for at least one Ge atom in the compound is 0 or 1.

In a still further embodiment, y is 2 or 3 and x+y is 4 or 5, with the proviso that if x is 2 and y is 2, then at least one of the following is true:
(i) n1 for at least one Si atom is 0, 1, or 2;
(ii) n2 for each Ge atom in the compound is 2; and
(iii) n2 for at least one Ge atom in the compound is 0 or 1.

Compounds according to formula I include any conformational form of the compound, including but not limited n, g, and iso-forms of the compounds, and combinations thereof.

Exemplary silicon-germanium hydrides according to formula I comprise or consist of those compounds listed in Table 1. All Si and Ge atoms in the compounds are tetravalent. Dashed lines represent bonds between Si and Ge atoms in the linear versions. In the isobutene- and isopentane-like isomers, the Si and Ge atoms inside the brackets are directly bound to the Si or Ge to the left of the brackets; the Si or Ge in parenthesis outside of the brackets at the far right in some of the compounds are directly bound to the last Si or Ge inside of the brackets.

For example, FIG. 1 shows compound i-Si(SiGeGe). As noted in Table 1, this compound is also referred to as SiH[(SiH$_3$)(GeH$_3$)$_2$].

TABLE 1

| 3 and 4 metal variants: | |
|---|---|
| (a) Linear | |
| SiH$_3$—SiH$_2$—GeH$_2$—GeH$_3$; | Si$_2$Ge$_2$H$_{10}$ |
| SiH$_3$—GeH$_2$—SiH$_2$—GeH$_3$; | Si$_2$Ge$_2$H$_{10}$ |
| SiH$_3$—GeH$_2$—GeH$_2$—SiH$_3$; | Si$_2$Ge$_2$H$_{10}$ |
| GeH$_3$—SiH$_2$—SiH$_2$—GeH$_3$; | Si$_2$Ge$_2$H$_{10}$ |
| SiH$_3$—SiH$_2$—GeH$_2$—SiH$_3$; | Si$_3$Ge$_1$H$_{10}$ |
| GeH$_3$—SiH$_2$—SiH$_2$—SiH$_3$; | Si$_3$Ge$_1$H$_{10}$ |
| SiH$_3$—SiH$_2$—GeH$_3$. | Si$_2$Ge$_1$H$_8$ |
| (b) iso-butane-like | |
| SiH[(SiH$_3$)(GeH$_3$)$_2$] | Si$_2$Ge$_2$H$_{10}$ |
| SiH[(SiH$_3$)$_2$(GeH$_3$)] | Si$_3$Ge$_1$H$_{10}$ |
| GeH[(GeH$_3$)(SiH3)$_2$] | Si$_2$Ge$_2$H$_{10}$ |
| GeH[(GeH$_3$)$_2$(SiH$_3$)] | Si$_2$Ge$_2$H$_{10}$ |
| 5 metal atom variants: | |
| 1 Ge: | |
| (a) Linear: | |
| SiH$_3$—SiH$_2$—SiH$_2$—SiH$_2$—GeH$_3$ | Si$_4$Ge$_1$H$_{12}$ |
| SiH$_3$—SiH$_2$—SiH$_2$—GeH$_2$—SiH$_3$ | Si$_4$Ge$_1$H$_{12}$ |
| SiH$_3$—SiH$_2$—GeH$_2$—SiH$_2$—SiH$_3$ | Si$_4$Ge$_1$H$_{12}$ |
| (b) Iso-pentane-like | |
| SiH[(GeH$_3$)(SiH$_3$)(SiH$_2$)](SiH$_3$) | Si$_4$Ge$_1$H$_{12}$ |
| SiH [(SiH$_3$)$_2$(SiH$_2$)](GeH$_3$) | Si$_4$Ge$_1$H$_{12}$ |
| SiH [(SiH$_3$)$_2$(GeH$_2$)](SiH$_3$) | Si$_4$Ge$_1$H$_{12}$ |
| GeH[(SiH$_3$)$_2$(SiH$_2$)](SiH$_3$) | Si$_4$Ge$_1$H$_{12}$ |
| SiH[(SiH$_3$)$_2$(GeH$_2$)](SiH$_3$) | Si$_4$Ge$_1$H$_{12}$ |
| Neopentane-like | |
| Si[(SiH$_3$)$_3$(GeH$_3$)] | Si$_4$Ge1H$_{12}$ |
| 2 Ge: | |
| (a) Linear: | |
| SiH$_3$—SiH$_2$—SiH$_2$—GeH$_2$—GeH$_3$ | Si$_3$Ge$_2$H$_{12}$ |
| SiH$_3$—SiH$_2$—GeH$_2$—SiH$_2$—GeH$_3$ | Si$_3$Ge$_2$H$_{12}$ |
| SiH$_3$—GeH$_2$—SiH$_2$—SiH$_2$—GeH$_3$ | Si$_3$Ge$_2$H$_{12}$ |
| GeH$_3$—SiH$_2$—SiH$_2$—SiH$_2$—GeH$_3$ | Si$_3$Ge$_2$H$_{12}$ |
| SiH$_3$—SiH$_2$—GeH$_2$—GeH$_2$—SiH$_3$ | Si$_3$Ge$_2$H$_{12}$ |
| SiH$_3$—GeH$_2$—SiH$_2$—GeH$_2$—SiH$_3$ | Si$_3$Ge$_2$H$_{12}$ |
| (b) Isopentane-like | |
| GeH[(SiH$_3$)$_2$(GeH$_2$)](SiH$_3$) | Si$_3$Ge$_2$H$_{12}$ |
| GeH[(SiH$_3$)$_2$(SiH$_2$)](GeH$_3$) | Si$_3$Ge$_2$H$_{12}$ |
| SiH[(GeH$_3$)(SiH$_3$)(GeH$_2$)](SiH$_3$) | Si$_3$Ge$_2$H$_{12}$ |
| SiH[(SiH$_3$)(GeH$_3$)(SiH$_2$)](GeH$_3$) | Si$_3$Ge$_2$H$_{12}$ |
| GeH[(GeH$_3$)(SiH$_3$)(SiH$_2$)]SiH$_3$ | Si$_3$Ge$_2$H$_{12}$ |
| SiH[(GeH$_3$)$_2$(SiH$_2$)]SiH$_3$ | Si$_3$Ge$_2$H$_{12}$ |
| (c) Neopentane like: | |
| Si[(SiH$_3$)$_2$(GeH$_3$)$_2$] | Si$_3$Ge$_2$H$_{12}$ |
| Ge[(SiH$_3$)$_3$(GeH$_3$)] | Si$_3$Ge$_2$H$_{12}$ |
| 3 Ge: | |
| (a) Linear | |
| SiH$_3$—SiH$_2$—GeH$_2$—GeH$_2$—GeH$_3$ | Si$_2$Ge$_3$H$_{12}$ |
| SiH$_3$—GeH$_2$—SiH$_2$—GeH$_2$—GeH$_3$ | Si$_2$Ge$_3$H$_{12}$ |
| GeH$_3$—SiH$_2$—SiH$_2$—GeH$_2$—GeH$_3$ | Si$_2$Ge$_3$H$_{12}$ |
| GeH$_3$—SiH$_2$—GeH$_2$—SiH$_2$—GeH$_3$ | Si$_2$Ge$_3$H$_{12}$ |
| SiH$_3$—GeH$_2$—GeH$_2$—GeH$_2$—SiH$_3$ | Si$_2$Ge$_3$H$_{12}$ |
| SiH$_3$—GeH$_2$—GeH$_2$—SiH$_2$—GeH$_3$ | Si$_2$Ge$_3$H$_{12}$ |
| (b) Isopentane-like | |
| GeH[(GeH$_3$)(SiH$_3$)(GeH$_2$)](SiH$_3$) | Si$_2$Ge$_3$H$_{12}$ |
| GeH[(SiH$_3$)$_2$(GeH$_2$)](GeH3$_3$) | Si$_2$Ge$_3$H$_{12}$ |
| SiH[(SiH$_3$)(GeH$_3$)(GeH$_2$)](GeH$_3$) | Si$_2$Ge$_3$H$_{12}$ |
| GeH[(GeH$_3$)(SiH$_3$)(SiH2)](GeH$_3$) | Si$_2$Ge$_3$H$_{12}$ |
| GeH[(GeH$_3$)$_2$(SiH2)](SiH$_3$) | Si$_2$Ge$_3$H$_{12}$ |
| SiH[(GeH$_3$)$_2$(GeH2)](SiH$_3$) | Si$_2$Ge$_3$H$_{12}$ |
| SiH[(GeH$_3$)$_2$(SiH2)](GeH$_3$) | Si$_2$Ge$_3$H$_{12}$ |
| (c) Neopentane like | |
| Si[(GeH$_3$)$_3$(SiH$_3$)] | Si2Ge$_3$H$_{12}$ |
| Ge[(GeH$_3$)$_2$(SiH$_3$)$_2$] | Si$_2$Ge$_3$H$_{12}$ |

As noted above, these compounds each include the n or g forms, and stereoisomers thereof.

FIG. 1 provides molecular structures of exemplary silicon-germanium hydrides according to this first aspect of the invention.

In a preferred embodiment, the silicon germanium hydride is selected from the group consisting of $SiH_3$—$SiH_2$—$GeH_2$—$GeH_3$; $SiH_3$—$GeH_2$—$SiH_2$—$GeH_3$; $SiH_3$—$GeH_2$—$GeH_2$—$SiH_3$; and $GeH_3$—$SiH_2$—$SiH_2$—$GeH_3$, and $SiH[(SiH_3)(GeH_3)_2]$.

This first aspect also provides compositions comprising combinations of the silicon germanium hydrides. In a preferred embodiment of such combinations, x is 3 and y is 1, or x is 2 and y is 2, for each of the two or more compounds. In a most preferred embodiment, the combination comprises compounds selected from the group consisting of $SiH_3$—$SiH_2$—$GeH_2$—$GeH_3$; $SiH_3$—$GeH_2$—$SiH_2$—$GeH_3$; $SiH_3$—$GeH_2$—$GeH_2$—$SiH_3$; and $GeH_3$—$SiH_2$—$SiH_2$—$GeH_3$, and $SiH[(SiH_3)(GeH_3)_2]$.

In a further embodiment, the compounds of the invention are substantially isolated. As used herein, a "substantially isolated" compound of the invention is one compound, or two or more compounds of the invention in combination, that are at least 75% isolated from precursors and other contaminants, and preferably 80%, 85%, 90%, 95%, 98%, or more isolated.

In a second aspect, the present invention provides semiconductor structures, comprising a substrate; and an Si—Ge layer formed by introducing near the surface of a substrate a gaseous precursor comprising or consisting of one or more silicon-germanium hydride compounds of formula I.

As shown herein, the silicon-germanium hydride compounds of formula I are especially useful for fabricating SiGe semiconductor alloys at unprecedented low temperatures that display homogeneous compositional and strain profiles, low threading dislocation densities and atomically planar surfaces. Controlled depositions have produced stoichiometric SiGe films reflecting the Si/Ge content of the precursor, and possessing the desired properties for semiconductor applications including perfectly crystalline and epitaxial microstructures, smooth morphologies, and uniformly strain-relaxed states.

In this aspect, the substrate can be any substrate suitable for semiconductor or flat panel display use, including but not limited to silicon, germanium, silicon on insulator, Ge:Sn alloys, $SiO_2$, sapphire, quartz, Si:Ge alloys, Si:C alloys, stainless steel, polyimide or other polymer films such as those used in the fabrication of flexible displays. In a preferred embodiment, the substrate comprises Si(100).

In a preferred embodiment, the semiconductor substrates of this aspect of the invention have an SiGe layer which comprises an SiGe film having a thickness of less than one micron, more preferably a thickness in a range from 50 nm to 500 nm. In a further preferred embodiment, the semiconductor substrates of this second aspect have an SiGe layer comprising an SiGe film having a density of threading defects of $10^6/cm^2$ or less. In a further preferred embodiment, the semiconductor substrates of this aspect of the invention comprise an SiGe film having a substantially atomically planar surface morphology.

In various embodiments, the gaseous precursor comprises or consists of one or more of the compounds listed in Table 1, each in n or g forms, and stereoisomers thereof.

In a preferred embodiment of the semiconductor substrates of the second aspect, the gaseous precursor comprises or consists of a compound selected from the group consisting of $SiH_3$—$SiH_2$—$GeH_2$—$GeH_3$; $SiH_3$—$GeH_2$—$SiH_2$—$GeH_3$; $SiH_3$—$GeH_2$—$GeH_2$—$SiH_3$; $GeH_3$—$SiH_2$—$SiH_2$—$GeH_3$, and $SiH[(SiH_3)(GeH_3)_2]$.

The semiconductor structure may further comprise other features as desired, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art.

In a further embodiment, the semiconductor structure may further comprise varying quantities if carbon or tin, as desired for a given application. Inclusion of carbon or tin into the semiconductor substrates can be carried out by standard methods in the art. The carbon can be used to reduce the mobility of the dopants in the structure and more specifically boron. Incorporation of Sn can yield materials with novel optical properties such as direct emission and absorption leading to the formation of Si-based lasers and high sensitivity infrared photodetectors.

In further aspect, the invention provides semiconductor structures, comprising a substrate and an Si—Ge layer comprising or consisting of a backbone of one or more compounds according to the formula I. Preferred embodiments are as described above.

In a further aspect, the invention provides a composition, comprising one or more compounds according to formula I in an inert gas. Such inert gases include, but are not limited to $H_2$, He, $N_2$, and argon. Preferred embodiments are as described above.

By using the compounds of formula I as precursors for preparing semiconductor substrates, the semiconductor substrate will comprise an Si—Ge layer comprising or consisting of a backbone of the compounds of the invention. By using the compounds of the invention, as opposed to the separate use of Si and Ge sources for deposition, the resulting Si—Ge layer comprises highly defined and uniform bonding arrangements and strain compensated Si—Ge atomic patterns, as opposed to the random nature of prior Si—Ge films in which the Si and Ge atoms can exist as an intimate mixture of several (or multi) atom Si and Ge clusters leading to inhomogeneous bonding and locally stressed configurations. In mismatched heteroepitaxy applications these materials exhibit copious dislocations (at levels unacceptable for most device applications), strain non-uniformities and high surface roughness. A distinct and important advantage of our compounds, films, and methods over conventional ones is that the incorporation of the entire Si—Ge molecular core promotes the formation of exceptionally uniform bonding arrangements over the entire crystal, leading to relaxed (or uniformly stressed) films with planar surface morphology (no surface ripples). A crucial advantage is the unprecedented low growth temperatures which reduce surface mobility of the Si and Ge atoms and prevent mass segregation thereby resulting in highly uniform compositional and strain profiles at the atomic level.

The intact incorporation of the massive Si/Ge cores into the film also leads to low surface diffusion and high sticking coefficients compared to the conventional low mass compounds. The high reactivity permits promotes high growth rates which increase systematically with the mass of the precursors Furthermore, the incorporation of the entire Si/Ge framework of the gaseous precursor into the lattice is particularly important in the formations of SiGe nanoscale systems (quantum dots and wires) because it allows precise control of morphology, tunable composition, and structure that cannot be accomplished by vapor deposition of separate silanes and germanes, or by molecular beam epitaxy of solid Si and Ge sources. The precise control of composition and corresponding morphology, both of which ultimately determine the physical properties of these nanoscale materials is a crucial issue. Any compositional variations that exist within and among individual nanostructures will have a significant impact on the optical and electronic properties and on the performance of devices. In the MBE case an average concentration is assigned on the basis of the flux ratio utilized to grow the materials. In the CVD approach the local stoichiometry on the scale of the nanostructure size is even less certain because reactions of various molecular sources cannot be simultaneously controlled at every site throughout the sample. Thus neither technique can guarantee systematic growth of Si—Ge nanoscale structures with controllable composition, strain and size.

Figure 13A:
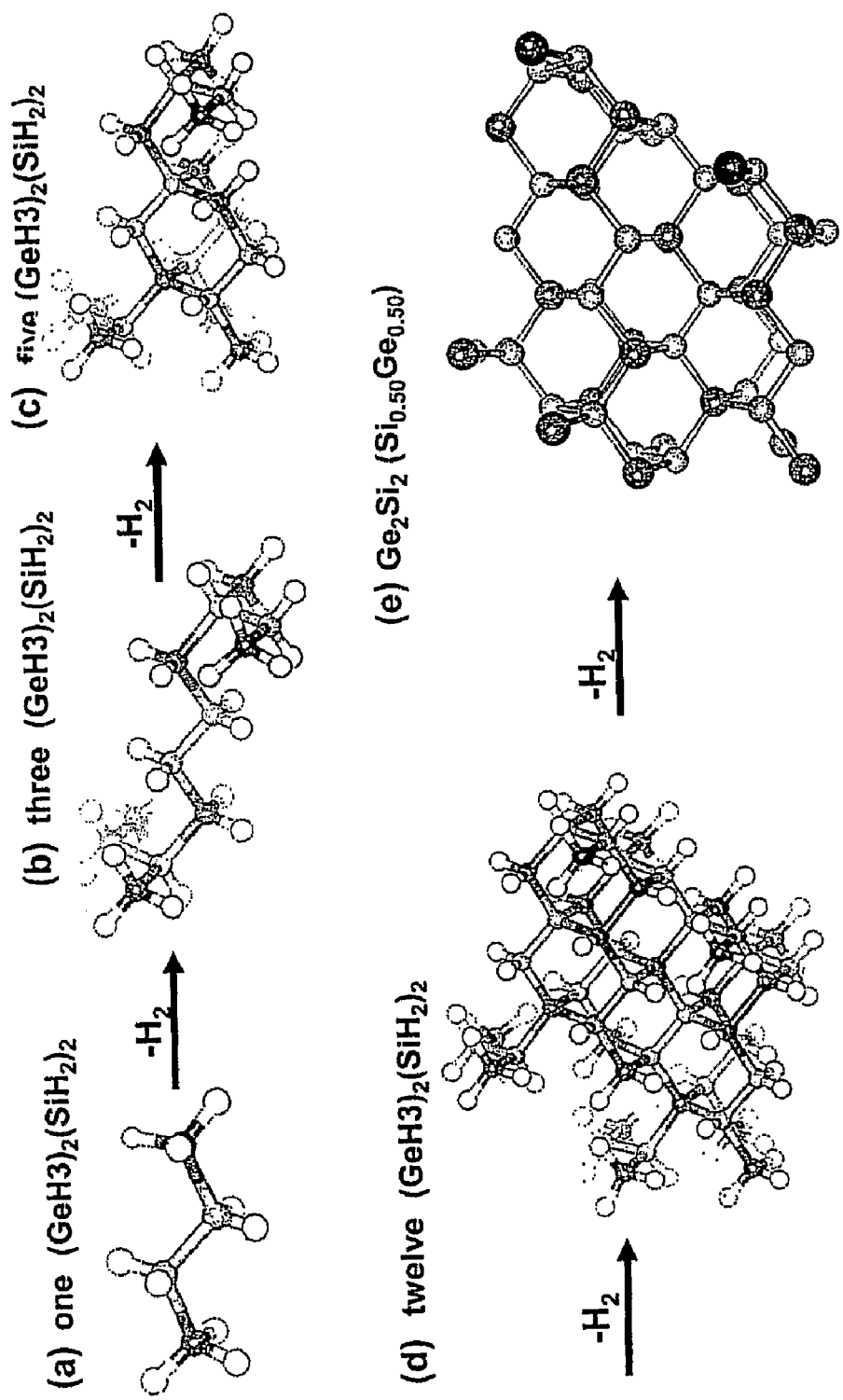
FIGS. 13A-B Exemplary sequence of macromolecular, polymeric units based on interconnected (GeH$_3$)$_2$(SiH$_2$)$_2$ monomers (a-d), en route to a diamond cubic Si—Ge lattice with concentration Ge$_2$Si$_2$ (Si$_{0.50}$Ge$_{0.50}$) (e). This material incorporates the Ge—Si—Si—Ge molecular core (GeH$_3$)$_2$(SiH$_2$)$_2$ as the structural and compositional building block.
Figure 13B:
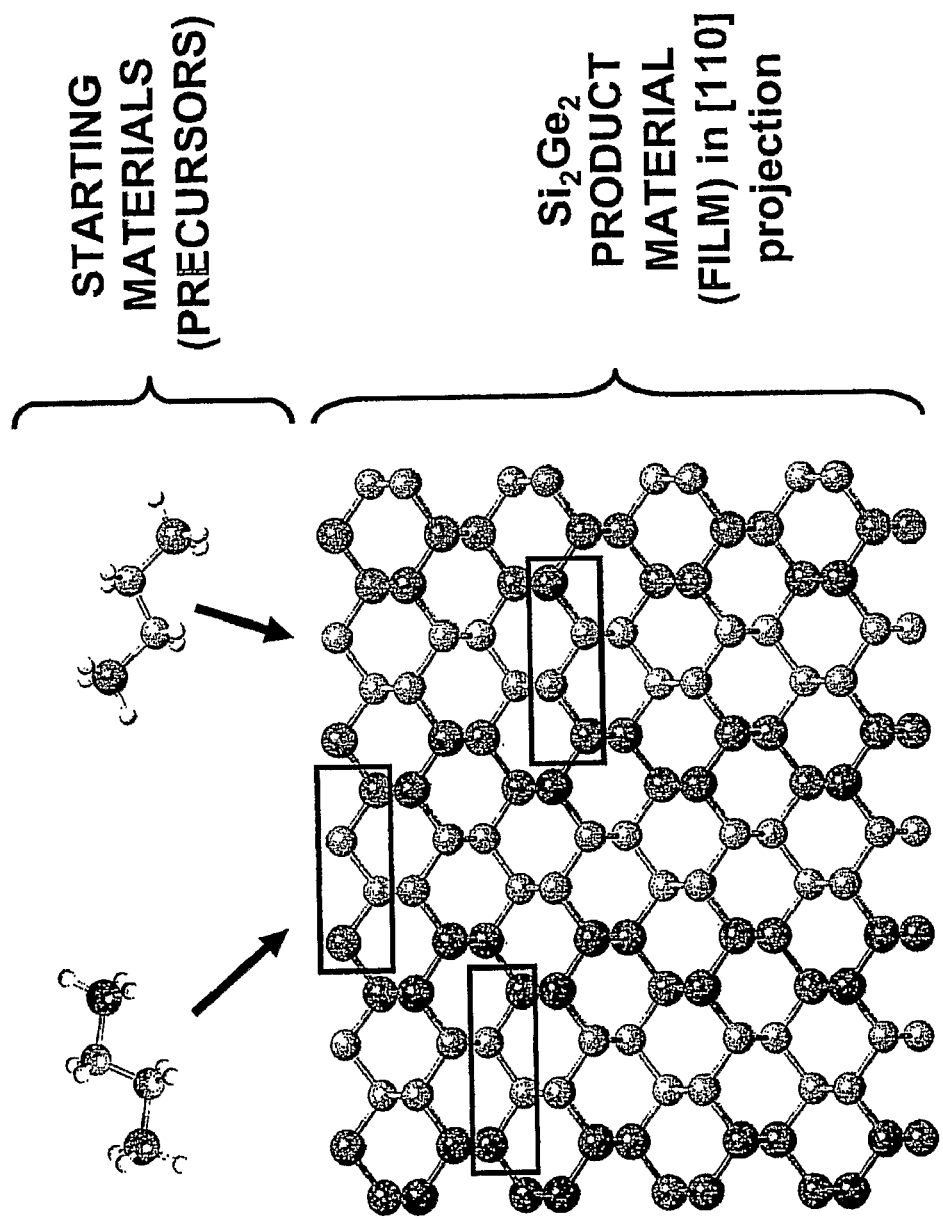

Such highly defined patterns can be determined using standard methods in the art, such as neutron diffraction An example of an Si—Ge layer comprising a backbone of the compounds of the invention can be found in FIG. 13, which shows an exemplary sequence of macromolecular, polymeric units of the invention, based on interconnected $(GeH_3)_2(SiH_2)_2$ monomers (a-d), en route to a diamond cubic Si—Ge lattice with concentration $Ge_2Si^2$ ($Si_{0.50}Ge_{0.50}$) (e). This material incorporates the Ge—Si—Si—Ge molecular core of $(GeH_3)_2(SiH_2)_2$ as the structural and compositional building block.

Figure 14:
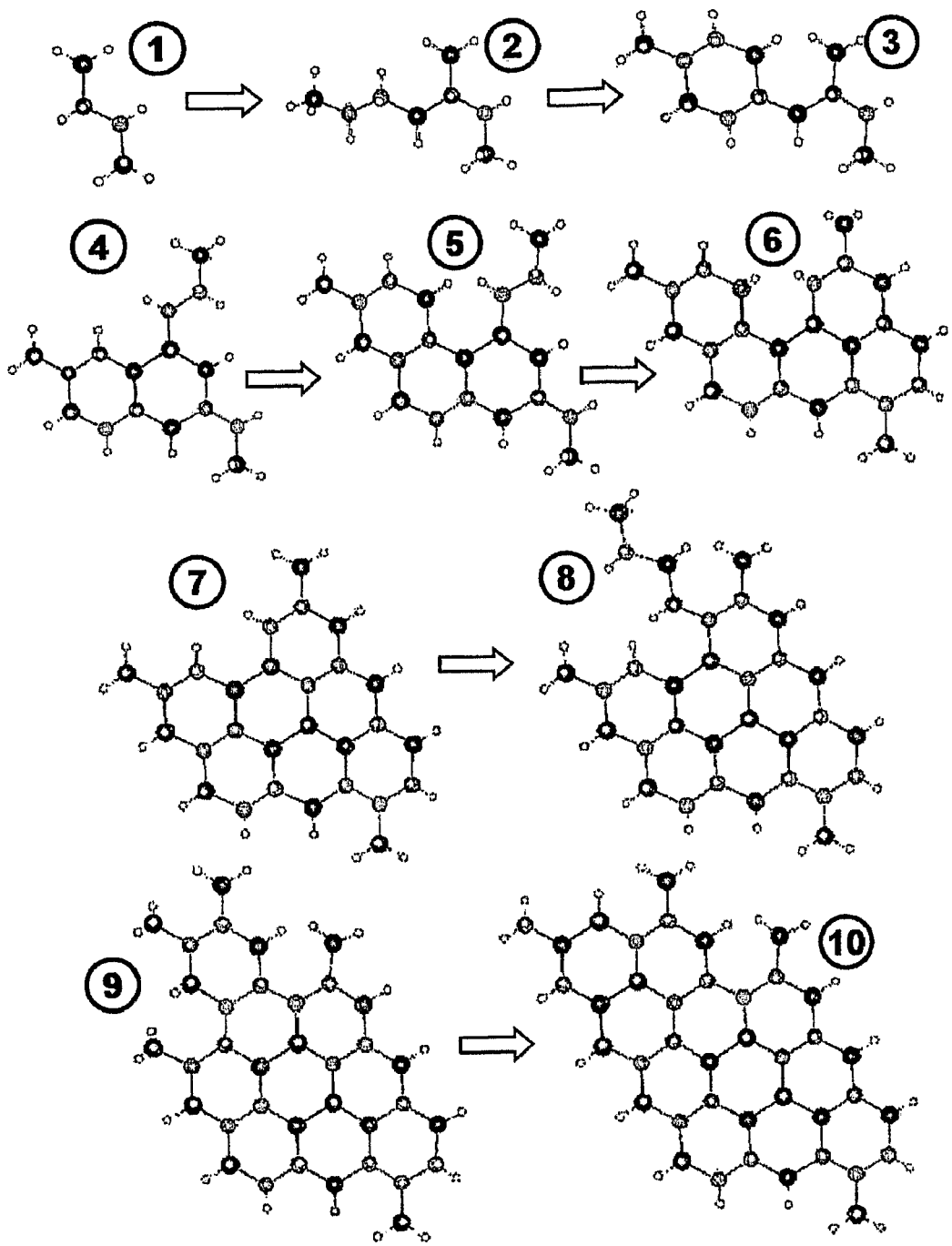
FIG. 14. Hypothetical growth sequence of a two dimensional island of composition Si$_{0.50}$Ge$_{0.50}$ containing a random distribution of Si and Ge atoms. The schematic process is viewed along the normal to the (111) growth plane, and involves the systematic addition of n-GeSiSiGe molecules and simultaneous abstraction of H$_2$ molecules. Legend: dark circles—Ge; light circles—Si; small white circles—H.
Figure 15:
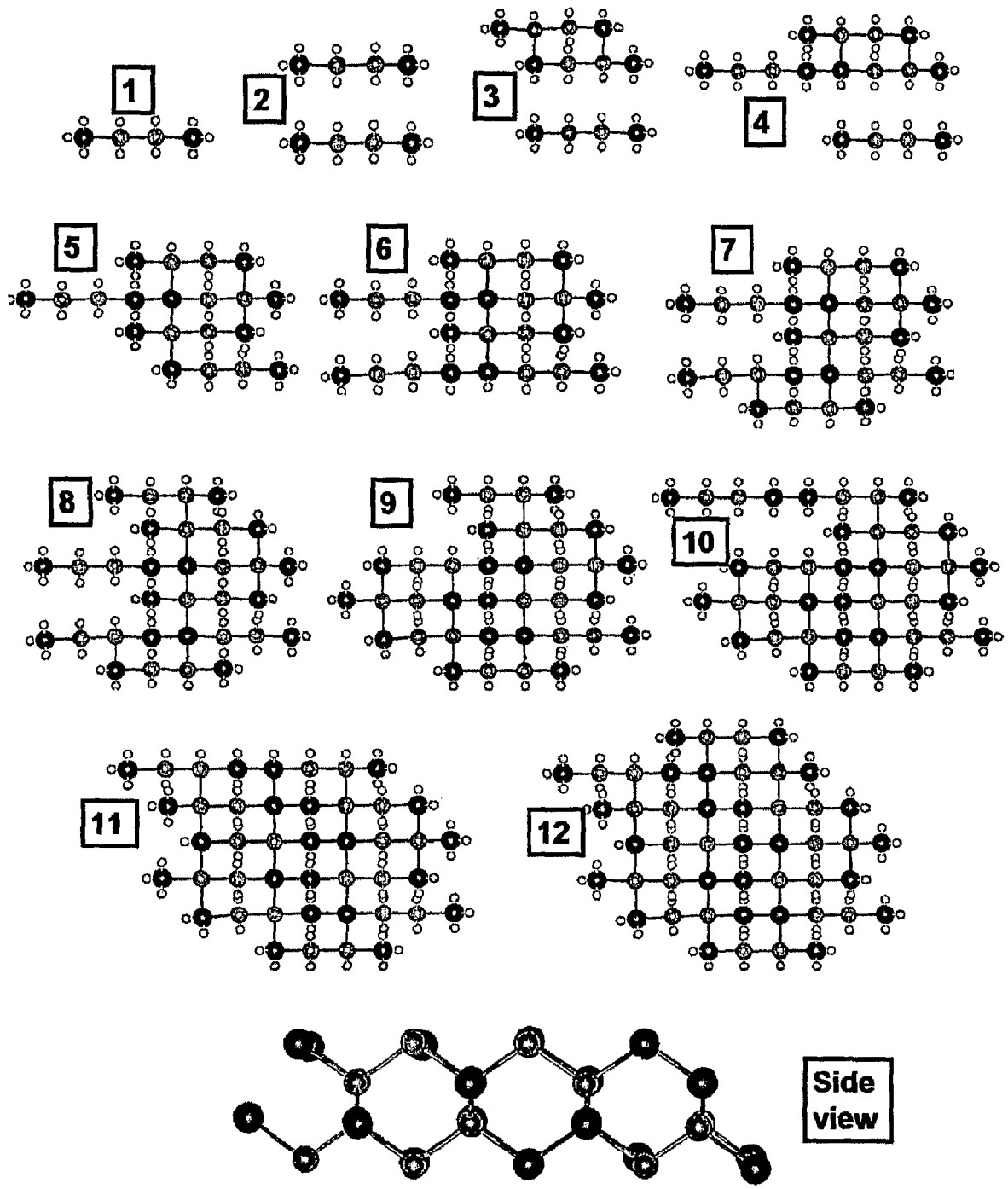
FIG. 15. Hypothetical growth sequence of a two dimensional island of composition Si$_{0.50}$Ge$_{0.50}$ containing a random distribution of Si and Ge atoms. The schematic process is viewed along the normal to the (001) growth plane, and involves the systematic addition of n-GeSiSiGe molecules and simultaneous abstraction of H$_2$ molecules. Legend: dark circles—Ge; light circles—Si; small white circles—H.

FIGS. 14 and 15 illustrate schematically, the molecule-by-molecule growth of a random 2D (one layer) clusters of SiGe film. FIG. 14 shows the hypothetical growth sequence of a two dimensional island of composition $Si_{0.50}Ge_{0.50}$ containing a random distribution of Si and Ge atoms. The schematic process is viewed along the normal to the (111) growth plane and involves the systematic addition of n-GeSiSiGe molecules and simultaneous abstraction of $H_2$ molecules. FIG. 15 is similar, but The schematic process is viewed along the normal to the (001) growth plane.

Thus, the compounds of the invention can be used to form a random alloy with intimate mixing of the elements using the GeSiSiGe precursors of formula I. The resulting Si—Ge backbone structure consists of polymerized units of the starting compound of the invention, wherein polymerization requires dehydrogenation.

As will be understood by those of skill in the art, other macromolecular, polymeric units of the invention, based on one or more other polymerized compounds of the invention can also lead to Si—Ge lattices with a desired concentration of Ge and Si based on the concentration of each in the compound used.

Preferred embodiments of this aspect are as discussed above for the second aspect of the invention.

In a third aspect, the present invention provides methods for synthesizing one or more silicon-germanium hydrides of formula I, $(SiH_{n1})_x(GeH_{n2})_y$, wherein the method comprises combining one or more perfluoroalkyl-sulfonate-substituted disilane with a compound comprising a $GeH_3$ ligand under conditions whereby the silicon-germanium hydride is formed. In a preferred embodiment, the perfluoroalkyl-sulfonate-substituted disilane is selected from the group consisting of a nonafluorobutane-sulfonic substituted disilane and a triflate substituted disilane Thus, this aspect provides methods for making the compounds of formula I. The synthetic routes described herein utilize high yield single-step substitution reactions to yield semiconductor grade materials suitable for industrial application and manufacturing processes.

In one embodiment of this third aspect, the compound comprising a $GeH_3$ ligand is selected from the group consisting alkali and alkaline earth germanides. In a preferred embodiment, the alkali or alkaline earth germanides are selected from the group consisting of $KGeH_3$, $NaGeH_3$, and $MR_3GeH_3$, wherein M is a group IV element and R is an organic ligand.

In a further embodiment of this third aspect, the method comprises combining the compound comprising a $GeH_3$ ligand with a nonafluorobutane-sulfonic substituted disilane, wherein the nonafluorobutane-sulfonic substituted disilane comprises $(SO_3C_4F_9)_2(SiH_2)_2$. In other embodiments, entire families of perfluoroalkyl sulfonyl and alkyl sulfonyl substituted silanes (or germanes) can be used. More preferably, the compound comprising a $GeH_3$ ligand is $KGeH_3$, and the silicon germanium hydride is formed according to the equation $(SO_3C_4F_9)_2(SiH_2)_2 + 2KGeH_3 \rightarrow (H_3Ge)_2(SiH_2)_2 + 2KSO_3C_4F_9$. Even more preferably, the method comprises:

(a) adding $(SO_3C_4F_9)_2(SiH_2)_2$ to a slurry of $KGeH_3$ in solvent at between $-50°$ C. and $-30°$ C. (more preferably about $-40°$ C.) to form a mixture;

(b) warming the mixture to between $-20°$ C. and $0°$ C. (more preferably about $-10°$ C.);

(c) stirring the mixture under nitrogen, (d) heating the mixture to between $25°$ C. and $45°$ C. (more preferably about $35°$ C.); and (e) distilling the mixture to form the $(H_3Ge)_2(SiH_2)_2$.

In an alternative embodiment of this third aspect, the method comprises combining the compound comprising a $GeH_3$ ligand with a triflate substituted disilane, and wherein the triflate substituted disilane comprises $(SO_3CF_3)_2(SiH_2)_2$. More preferably, the compound comprising a $GeH_3$ ligand is $KGeH_3$, and the silicon germanium hydride is formed according to the equation $(SO_3CF_3)_2(SiH_2)_2 + 2KGeH_3 \rightarrow (H_3Ge)_2(SiH_2)_2 + 2KSO_3CF_3$. Even more preferably, the method comprises (a) adding $(SO_3CF_3)_2(SiH_2)_2$ to a slurry of $KGeH_3$ in solvent at between $-40°$ C. and $-10°$ C. (more preferably about $-30°$ C.) to form a mixture;

(b) optionally warming the mixture to between $10°$ C. and $35°$ C. (more preferably about $23°$ C.);

(c) stirring the mixture under nitrogen; and (d) distilling the mixture to form the $(H_3Ge)_2(SiH_2)_2$.

In this embodiment, low temperature ($T<-10°$ C.) reactions of $(SO_3CF_3)_2(SiH_2)_2$ with $KGeH_3$ afforded predominately $(H_3Ge)_2(SiH_2)_2$ and impurity levels of $(GeH_3)_2(SiH_2GeH_2)$. These species can be separated by distillation. In contrast to the low temperature pathways, the reaction of $(SO_3CF_3)_2(SiH_2)_2$ with $KGeH_3$ at $T \geq 22°$ C. yields predominately combinations of the positional isomers $(GeH_3)_2(SiH_2)_2$ and $(GeH_3)_2SiH(SiH_3)$ in varying proportions (a small amount of $(GeH_3)_2(SiH_2GeH_2)$ is also produced but this is readily separated form the bulk via fractional distillation from the $(SO_3CF_3)_2(SiH_2)_2$ and $(GeH_3)_2(SiH_2GeH_2)$ mixture.

In a fourth aspect, the present invention provides methods for depositing a Si—Ge material on a substrate in a reaction chamber, comprising introducing into the chamber a gaseous precursor comprising or consisting of one or more compounds according to formula I, under conditions whereby a layer comprising a Si—Ge material is formed on the substrate.

In a fifth aspect, the present invention provides methods for depositing an epitaxial Si—Ge layer on a substrate, comprising introducing near a surface of the substrate a gaseous precursor comprising or consisting of one or more compounds according to formula I, and dehydrogenating the precursor under conditions whereby epitaxial Si—Ge is formed on the substrate.

In this aspect, the substrate can be any substrate suitable for semiconductor or flat panel display use, including but not limited to silicon, germanium, silicon on insulator, Ge:Sn alloys, SiO$_2$ sapphire, quartz, Si:Ge alloys, Si:C alloys, stainless steel, polyimide or other polymer films. In a preferred embodiment, the substrate comprises Si(100).

Embodiments of the gaseous precursors are as described above for previous aspects of the invention. For example, the methods may further comprise adding a dopant on the substrate, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art.

In another embodiment, the methods comprise adding varying quantities if carbon or tin to the semiconductor substrate. Inclusion of carbon or tin into the semiconductor substrates can be carried out by standard methods in the art. The carbon can be used to reduce the mobility of the dopants in the structure and more specifically boron. Incorporation of Sn can yield materials with novel optical properties such as direct emission and absorption leading to the formation of Si-based lasers and high sensitivity infrared photodetectors.

As demonstrated herein, the silicon-germanium hydrides of the invention were used to deposit device quality layers on substrates that display homogeneous compositional and strain profiles, low threading dislocation densities and atomically planar surfaces.

In a preferred embodiment of the fourth and fifth aspects of the invention, the step of introducing the gaseous precursor comprises introducing the gaseous precursor in substantially pure form. In a further preferred embodiment, the step of introducing the gaseous precursor comprises introducing the gaseous precursor as a single gas source.

In another embodiment of the fourth and fifth aspects, the step of introducing the gaseous precursor comprises introducing the gaseous precursor intermixed with an inert carrier gas. In this embodiment, the inert gas can be, for example, He, argon, H$_2$ or N$_2$.

In these aspects, the gaseous precursor can be deposited by any suitable technique, including but not limited to gas source molecular beam epitaxy, chemical vapor deposition, plasma enhanced chemical vapor deposition, laser assisted chemical vapor deposition, and atomic layer deposition.

In a preferred embodiment of the fourth and fifth aspects, the gaseous precursor is introduced at a temperature of between 300° C. and 450° C., more preferably between 350° C. and 450° C. Practical advantages associated with this low temperature/rapid growth process include (i) short deposition times compatible with preprocessed Si wafers, (ii) selective growth for application in high frequency devices, and (iii) negligible mass segregation of dopants, which is particularly critical for thin layers.

In various further embodiments of the fourth and fifth aspects, the gaseous precursor is introduced at a partial pressure between 10$^{-8}$ Torr and 1000 Torr. In one preferred embodiment, the gaseous precursor is introduced at between 10$^{-8}$ Torr and 10$^{-5}$ Torr (corresponding to UHV vertical furnace technology). In another preferred embodiment, the gaseous precursor is introduced at between 10$^{-8}$ Torr and 100 Torr, corresponding to LPCVD conditions.

In various other preferred embodiments, the Si—Ge material is formed on the substrate as a strain-relaxed layer having a planar surface; the composition of the Si—Ge material is substantially uniform; and/or the entire Si and Ge framework of the gaseous precursor is incorporated into the Si—Ge material or epitaxial Si—Ge.

In a sixth aspect, the present invention provides a compound comprising or consisting of (SO$_3$C$_4$F$_9$)$_2$(SiH$_2$)$_2$, as well as methods for making the compound. As disclosed herein, (SO$_3$C$_4$F$_9$)$_2$(SiH$_2$)$_2$ is useful as an intermediate in the synthesis of the silicon-germanium hydrides of the invention. In one embodiment, methods for synthesizing (SO$_3$C$_4$F$_9$)$_2$(SiH$_2$)$_2$ comprise combining R(SiH$_2$)$_2$ and HSO$_3$C$_4$F$_9$ under conditions whereby the (SO$_3$C$_4$F$_9$)$_2$(SiH$_2$)$_2$ is formed, where R is an aryl substituent. Such aryl substituents include, but are not limited to, p-tolyl and benzyl.

In a preferred embodiment, methods for synthesizing (SO$_3$C$_4$F$_9$)$_2$(SiH$_2$)$_2$ comprise combining (p-tolyl)$_2$(SiH$_2$)$_2$ and HSO$_3$C$_4$F$_9$ under conditions whereby the (SO$_3$C$_4$F$_9$)$_2$(SiH$_2$)$_2$ is formed. Preferably, the (SO$_3$C$_4$F$_9$)$_2$(SiH$_2$)$_2$ is formed according to the equation

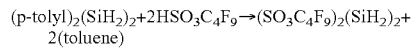

(p-tolyl)$_2$(SiH$_2$)$_2$+2HSO$_3$C$_4$F$_9$→(SO$_3$C$_4$F$_9$)$_2$(SiH$_2$)$_2$+ 2(toluene)

More preferably, the method comprises (a) combining HSO$_3$C$_4$F$_9$, (p-tolyl)$_2$(SiH$_2$)$_2$, and solvent in a reaction chamber at between −50° C. and 0° C. to form a mixture;
(b) warming the mixture to between 20° C. and 25° C.;
(c) stirring the mixture; and
(d) filtering the solid (SO$_3$C$_4$F$_9$)$_2$(SiH$_2$)$_2$.

EXAMPLES

The synthesis of butane-like (GeH$_3$)$_2$(SiH$_2$)$_2$ (Referred to above as GeH$_3$—SiH$_2$—SiH$_2$—GeH$_3$ (1), (GeH$_3$)$_2$SiH(SiH$_3$) (referred to above as SiH[(GeH$_3$)$_2$(SiH$_3$)] (2) and (GeH$_3$)$_2$(SiH$_2$GeH$_2$) (also referred to as GeH$_3$—SiH$_2$—GeH$_2$—GeH$_3$ (3) Si—Ge hydrides with applications in low temperature synthesis of Ge-rich Si$_{1-x}$Ge$_x$ optoelectronic alloys is herein demonstrated. The compositional, vibrational, structural and thermochemical properties of these compounds were studied by FTIR, multinuclear NMR, mass spectrometry, Rutherford backscattering, and density functional theory (DFT) simulations. The analyses indicate that the linear (GeH$_3$)$_2$(SiH$_2$)$_2$ (1) and (GeH$_3$)$_2$(SiH$_2$GeH$_2$) (3) compounds exist as a mixture of the classic normal and gauche conformational isomers which do not seem to interconvert at 22° C. The conformational proportions in the samples were determined using a new fitting procedure, which combines calculated molecular spectra to reproduce those observed by varying the global intensity, frequency scale and admixture coefficients of the individual conformers. The (GeH$_3$)$_2$(SiH$_2$)$_2$ (1) species was then utilized to fabricate Si$_{0.50}$Ge$_{0.50}$ semiconductor alloys reflecting exactly the Si/Ge content of the precursor. Device quality layers were grown via gas source MBE directly on Si(100) at unprecedented low temperatures 350-450° C. and display homogeneous compositional and strain profiles, low threading dislocation densities and atomically planar surfaces. Low energy electron microscopy (LEEM) analysis has demonstrated that the precursor is highly reactive on Si(100) surfaces, with H$_2$ desorption kinetics comparable to those of Ge$_2$H$_6$, despite the presence of strong Si—H bonds in the molecular structure.

Results and Discussion

The synthesis of the main product 1,2-digermyldisilane, (H$_3$Ge)$_2$(SiH$_2$)$_2$ (1) was accomplished via reactions of KGeH$_3$ with the nonafluorobutane-sulfonic and triflate substituted disilanes (C$_4$F$_9$SO$_3$)$_2$(SiH$_2$)$_2$ (4) and (SO$_3$CF$_3$)$_2$(SiH$_2$)$_2$ (5) as illustrated by Eq 1 and 2 respectively. The starting materials (4) and (5) were prepared via reactions of the corresponding sulfonic acids HSO$_3$C$_4$F$_9$ and HSO$_3$CF$_3$ with 1,2-(p-tolyl)$_2$(SiH$_2$)$_2$ (Eq 3 and 4, respectively).

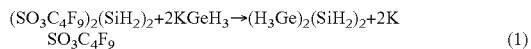

$$(SO_3C_4F_9)_2(SiH_2)_2 + 2KGeH_3 \rightarrow (H_3Ge)_2(SiH_2)_2 + 2KSO_3C_4F_9 \qquad (1)$$

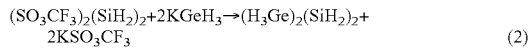

$$(SO_3CF_3)_2(SiH_2)_2 + 2KGeH_3 \rightarrow (H_3Ge)_2(SiH_2)_2 + 2KSO_3CF_3 \qquad (2)$$

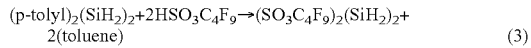

$$(p\text{-tolyl})_2(SiH_2)_2 + 2HSO_3C_4F_9 \rightarrow (SO_3C_4F_9)_2(SiH_2)_2 + 2(\text{toluene}) \qquad (3)$$

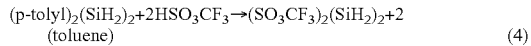

$$(p\text{-tolyl})_2(SiH_2)_2 + 2HSO_3CF_3 \rightarrow (SO_3CF_3)_2(SiH_2)_2 + 2(\text{toluene}) \qquad (4)$$

The route described by (Eq 1) consistently produces pure, single-phase $(H_3Ge)_2(SiH_2)_2$ (1) as a colorless, pyrophoric liquid. Here the replacement of —$SO_3C_4F_9$ by $GeH_3$ occurs exclusively at the 1,2-substitution sites of $(SO_3C_4F_9)_2(SiH_2)_2$ (4), as expected. However, the route described by (Eq 2) yields a mixture of products (FIG. 2) including $(GeH_3)_2(SiH_2)_2$ (1), the isobutane analog $(GeH_3)_2SiH(SiH_3)$ (2), and the Ge-rich derivative $(GeH_3)_2(SiH_2GeH_2)$ (3) depending on reaction conditions. Specifically, low temperature (T<−10° C.) reactions of $(SO_3CF_3)_2(SiH_2)_2$ (5) with $KGeH_3$ (Eq 2) afforded predominately (1) and impurity levels of (3). These species are separated by distillation and the minor low volatility fraction (vapor pressure of ~1 Torr at 22° C.) was characterized by a variety of spectroscopic methods as the Ge-rich derivative (3) possessing a heteronuclear $H_2Si$—$GeH_2$ core (FIG. 1). In contrast to the low temperature pathways, the reaction of $(SO_3CF_3)_2(SiH_2)_2$ (5) with $KGeH_3$ at $T \geq 22°$ C. yields predominately combinations of the positional isomers (1) and (2) in varying proportions (a small amount of (3) is also produced but this is readily separated form the bulk via fractional distillation from the (1) and (2) mixture). In this case the replacement of $SO_3CF_3$ by $GeH_3$ initially occurs at the 1-substitution site of $(SO_3CF_3)_2(SiH_2)_2$ (5) as expected. The second replacement likely produces germyl disilane, $SiH_3SiH_2GeH_3$, and a stable germylene intermediate $(GeH_2)$ rather than the 1,2-digermyldisilane, $(H_3Ge)_2(SiH_2)_2$ (1). Insertion of $GeH_2$ into $SiH_3SiH_2GeH_3$ then may yield $(GeH_3)_2SiH(SiH_3)$ (3) as shown in Eq 6. A similar insertion mechanism (discussed in detail in subsequent sections) has been observed in the photochemical generation of gas phase $i\text{-}Si_4H_{10}$ from $SiH_2$ insertion into trisilane $SiH_3$—$SiH_2$—$SiH_3$ (Eq 7):

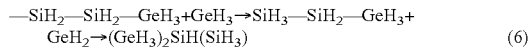

$$—SiH_2—SiH_2—GeH_3 + GeH_3 \rightarrow SiH_3—SiH_2—GeH_3 + GeH_2 \rightarrow (GeH_3)_2SiH(SiH_3) \qquad (6)$$

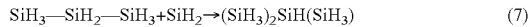

$$SiH_3—SiH_2—SiH_3 + SiH_2 \rightarrow (SiH_3)_2SiH(SiH_3) \qquad (7)$$

The synthesis of (5) is described by (Eq 4) and has been previously demonstrated elsewhere. Its $(p\text{-tolyl})_2(SiH_2)_2$ starting materials has been produced via coupling reactions of $(p\text{-tolyl})SiH_2Cl$ with powdered lithium.[10] In the present work we adopt a more convenient, analogous approach using readily available sodium fragments as the coupling agent. Compound (5) is obtained as a highly reactive liquid, which is difficult to fully handle and purify. Consequently its reactions with $KGeH_3$ are complex and produce mixtures of products as described above. In contrast the newly prepared compound (4) is readily crystallized as a robust molecular solid that is completely isolated from the reaction byproducts and other contaminants, thereby leading to high purity $(H_3Ge)_2(SiH_2)_2$ in subsequent steps according to (Eq 1). The compositional, vibrational and structural properties of the newly synthesized compounds (1), (2), (3) and (4) are presented below.

$(H_3Ge)_2(SiH_2)_2$ (1): The $(H_3Ge)_2(SiH_2)_2$ (1) species is prepared as described by the reactions depicted in (Eq 1,2) and was isolated and purified by fractional distillation (vapor pressure of ~8-10 Torr at 22° C.). The FTIR, $^{29}Si$ NMR (proton-coupled) and mass spectra indicate a 1,2-digermyldisilane with a butane-like structure as shown in FIG. 1. The IR spectrum shows the Si—H and Ge—H stretching modes at 2147 and 2073 cm$^{-1}$, respectively, and a set of absorption bands between 910 and 442 cm$^{-1}$ corresponding to the bending modes of the molecule. These assignments are consistent with those made previously for the $(H_3Ge)_{4-x}SiH_x$ (x=1-4) family of silyl germanes.[7] A more detailed interpretation of the full IR spectrum is obtained from quantum chemical calculations and the data show fixed combinations between the butane-like normal and gauche conformers of (1) (see section below for details). The $^1H$ NMR spectra reveals a quartet at 3.29 ppm and a triplet at 3.11 ppm corresponding to the Si—H and Ge—H protons, respectively, which is consistent with a $H_3Ge$—$SiH_2$—$SiH_2$—$GeH_3$ molecular structure. This structure is further confirmed with 2D $^1H$ COSY and $^1H$—$^{29}Si$ HMQC NMR experiments. The 2D $^1H$ COSY spectrum showed cross-peaks that correlate to Si—H and Ge—H resonances at 3.29 and 3.11 ppm, respectively, indicating the H—Si—Ge—H connectivity. A proton-decoupled $^1H$—$^{29}Si$ HMQC spectrum showed that the H atoms at 3.29 ppm are directly attached to Si atoms at −105 ppm. The mass spectra revealed an isotopic envelope at 210-196 amu as the highest mass peak corresponding to the parent ion, $(Si_2Ge_2H_x^+)$. The associated fragmentation pattern is consistent with the proposed structure. The existence of (1) was further corroborated by Rutherford backscattering (RBS) analysis of monocrystalline films produced by single source MBE depositions of the compound at 350° C. (Eq 8). The Si/Ge elemental content of the films was consistently 1:1 reflecting precisely the composition of the $Si_2Ge_2$ core of the molecule.

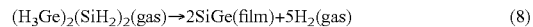

$$(H_3Ge)_2(SiH_2)_2(gas) \rightarrow 2SiGe(film) + 5H_2(gas) \qquad (8)$$

$(GeH_3)_2SiH(SiH_3)$ (2): The isobutane-like structure of (2) was determined by $^{29}Si$ and $^1H$ NMR studies. The proton NMR resonances are present as a multiplet centered at 3.049 ppm due to —SiH, and two doublets centered at 3.213 and 3.404 ppm corresponding to the (—$GeH_3$)$_2$ and —$SiH_3$ protons, respectively. The integrated peak intensity ratios of the —SiH, (—$GeH_3$)$_2$ and —$SiH_3$ are 1:6:3, respectively, as expected. The peak intensities, the coupling patterns and the position of the peaks in the spectrum, collectively point to the isobutane-like structure in which an Si center is terahedrally bonded to two $GeH_3$ groups one $SiH_3$ group and an single H atom. This structure is further confirmed by 2D $^1H$ COSY and $^1H$—$^{29}Si$ HMQC NMR measurements. The 2D $^1H$ COSY spectrum showed cross-peaks that correlate to the central SiH, and terminal $GeH_3$ and $SiH_3$ resonances at 3.049, 3.213 and 3.404 ppm, respectively, indicating a $H_3Si$—SiH—$(GeH_3)_2$ connectivity, which is consistent with the proposed isobutane structure. A proton-decoupled $^1H$—$^{29}Si$ HMQC spectrum showed that the H atoms at 3.049 and 3.404 ppm are directly bonded to Si atoms at −121 and −93 ppm, respectively. The $^{29}Si$ chemical shift (−121 ppm, in $C_6D_6$) due to the central Si atom in this molecule is similar to those found for $SiH(GeH_3)_3$ (−113 ppm in CDCl$_3$) and $Si(GeH_3)_4$ (−128 ppm, in CDCl$_3$). A close correspondence is also found between the $^{29}Si$ chemical shift (−93 ppm) due to the terminal Si atom and those of the terminal $SiH_3$ groups (−92 ppm) for $H_3SiGeH_3$.

Gas-chromatography mass-spectrometry experiments (GCMS) of samples containing (1) $(H_3Ge)_2(SiH_2)_2$ and $(GeH_3)_2SiH(SiH_3)$ (2) indicated the presence of two major fractions that displayed slightly different retention times in the GC column, which is consistent with a mixture of (1) and (2) possessing slightly different boiling points. Furthermore, these fractions displayed essentially identical mass spectra.

The highest mass peak is observed in the 210-196 amu range corresponding to the ($Si_2Ge_2H_x^+$) parent ions of (1) and (2). Samples of the mixture were further characterized by IR spectroscopy. The spectra are essentially a simple admixture of the individual (1) and (2) components. The spectrum of (2) was theoretically determined since the compound could not be completely separated in pure form from (1) via our distillation method due to the similarity in their boiling points. The contributions of the each compound in the experimental IR spectra were then determined using a fitting procedure involving both the observed and the calculated spectra.

$(GeH_3)_2(SiH_2GeH_2)$ (3): Compound (3) is a byproduct of the reaction described by Eq 2. Its gas-phase IR spectrum shows the Si—H and Ge—H stretching bands centered at 2145 and 2073 $cm^{-1}$, respectively. The intensity of the Ge—H peak in the spectrum is significantly stronger than the Si—H due to the greater number of Ge—H bonds relative to Si—H bonds. The $^1$H NMR spectra showed a set of two sextets at 3.30 and 3.03 ppm ensconcing two triplets at 3.23, 3.13 ppm. The integrated peak intensity ratios of the sextet-triplet-triplet-sextet sequence are 2:3:3:2. The integrated intensities the coupling patterns and the position of the peaks in the NMR spectrum collectively point to a $H_3Ge$—$SiH_2$—$GeH_2$—$GeH_3$ molecular structure in which a central $SiH_2GeH_2$ core is bonded with two terminal $GeH_3$ moieties. In particular, the sextets at 3.30 and 3.03 ppm can be associated, respectively, with the $SiH_2$ and $GeH_2$ protons of the central —$SiH_2GeH_2$— while the triplets at 3.23, 3.13 ppm correspond to terminal GeH3 protons. The $SiH_2$ and $GeH_2$ NMR frequencies in this case correlate well with those in the previously reported $(H_3Ge)_2SiH_2$ and $GeH_3GeH_2SiH_3$ compounds.[7] The assignment of the sextet at 3.30 ppm to the $SiH_2$ protons was further corroborated by a $^1$H—$^{29}$Si HMQC NMR spectrum, which indicates a direct coupling to a single $^{29}$Si resonance found at −98.2 ppm. In addition, a 2D $^1$H COSY NMR spectrum was used to unequivocally establish the specific ordering of the Ge—Si—Ge—Ge backbone constituents. Cross-peaks correlate an Si—H and three Ge—H resonances at 3.30, 3.23, 3.13 and 3.03 ppm. These correspond, respectively, to $SiH_2$, $GeH_3$ (terminal) connected to $GeH_2$, Ge—$H_3$ (terminal) connected to $SiH_2$, and $GeH_2$. The mass spectra showed an isotopic envelope at 256-238 amu as the highest mass peak corresponding to the parent ion, ($SiGe_3H_x^+$) and a fragmentation pattern consistent with the molecular structure.

$(C_4F_9SO_3)_2(SiH_2)_2$ (4): Compound (4) is isolated at 95% yield as a colorless, pyrophoric solid with a melting point of 68° C. It is readily soluble in ethers, $CHCl_3$, $CH_2Cl_2$ and slightly soluble in toluene. The $^1$H NMR spectrum showed a singlet centered at 5.08 ppm (δ Si—H) due to $SiH_2$ and $^{29}$Si satellite peaks. These exhibit a triplet of triplets with a 1-bond Si—H coupling of 272 Hz and a H—H 3-bond coupling of 3.6 Hz. This indicates the presence of a second $SiH_2$ group consistent with the —$SiH_2SiH_2$-core. Furthermore, a proton decoupled $^1$H—$^{29}$Si HMQC showed that the proton resonance at 5.08 ppm is directly attached to a Si atom at −30.1 ppm. These values are consistent with those observed for the triflate analog $(SO_3CF_3)_2(SiH_2)_2$ (5).[10] Compound (4) was further characterized by FTIR, mass spectrometry and C, H, F elemental analysis and the data are fully consistent with the proposed structure (see experimental section).

Ab Initio Simulations of Molecular Properties

Structural and thermochemical properties: In order to corroborate the identification of the $(GeH_3)_2(SiH_2)_2$, $(GeH_3)_2SiH(SiH_3)$ and $(GeH_3)_2(SiH_2GeH_2)$ described above we simulated the structural, energetic and vibrational trends of these compounds. In prior studies[7] we demonstrated that B3LYP hybrid density functional theory (DFT) simulations provide an excellent account of the ground state structural, thermochemical and vibrational properties of the $(H_3Ge)_xSiH_{4-x}$ family of molecular hydrides. In particular use of the 6-311G++(2d,2p) basis set yielded small typical bond length and frequency discrepancies (on the order of 0.4% and 1.4%, respectively). Accordingly, our first attempt at reconciling the observed IR spectra with those calculated was based on the same procedure, and on the assumption that the fundamental structures are n-butane like. Although this approach provided a close match to most of the main spectral features observed, several strong low-frequency features remained unaccounted for in the calculated IR pattern. In view of the prior success of B3LYP approach we concluded that n-butane like molecular structures alone could not account for the spectrum of the synthesized compounds. We therefore expanded our calculations to include the gauche conformational isomers in which a terminal $GeH_3$ group is rotated out of the Ge—Si—Si—Ge (or Ge—Si—Ge—Ge) skeletal plane, as well as the iso-butane like positional isomer i-Si(SiGeGe) (FIG. 1). These isomers are completely analogous to those previously reported in tetrasilane, and related molecules, and in subsequent discussion we simply refer to them as n-GeSiSiGe, g-GeSiSiGe, n-GeSiGeGe and g-GeSiGeGe, and i-Si(SiGeGe), as shown in FIG. 1. Our results indicate that the observed spectra of both the primary products and the minor impurity compounds are completely accounted for by a linear admixture of the n-, g-, and i-type conformations.

Initial basis set convergence tests showed that a full resolution of differences in the calculated properties of the conformational/positional isomers requires an even more stringent treatment than that used in the prior studies on $(H_3Ge)_xSiH_{4-x}$ hydrides, particularly with regards to calculated vibrational properties. Accordingly all of the calculations described in the present work were carried out at the B3LYP/6-311G++(3df,2pd) level as implemented in the Gaussian03 code.[11]

The results of the structural optimizations, obtained using "tight" convergence criteria, are presented in FIG. 12. The figure lists the bond length, bond angle and bond torsion data for n-GeSiSiGe, g-GeSiSiGe, n-GeSiGeGe, g-GeSiGeGe and i-Si(SiGeGe). In all molecules, the skeletal structure exhibits typical Si—Si and Si—Ge bonds with the gauche conformations exhibiting slightly (0.002 Å) longer/shorter Si—Si/Si—Ge bonds than their linear counterparts. In the iso-butane like isomer i-Si(SiGeGe) the Si—Si bond lengths (2.351 Å) are found to be intermediate to those in the other isomers while the Si—Ge bond is dilated to a value 2.400 Å. All the Si—Si values, 2.350-2.352 Å, correspond closely (~0.1%) to that found in bulk silicon a√3/4=2.352 Å where a (5.431 Å) is the lattice constant of crystalline Si in the diamond structure. The Ge—Ge values found in n-GeSiGeGe and g-GeSiGeGe, 2.446 Å, is also close to that of bulk germanium (2.449 Å). The heteronuclear skeletal Si—Ge bond lengths exhibit a distribution in the range 2.396-2.400 Å and represent an average of the Si—Si and Ge—Ge values (2.399 Å).

The Si—H and Ge—H bond lengths occur exclusively as central $SiH_2$ moieties and terminal $GeH_3$ groups in the n- and g-GeSiSiGe isomers, with values of 1.486 Å and 1.539 Å, respectively. In the corresponding GeSiGeGe isomers the Si—H bonds associated with the $SiH_2$ moiety has essentially the same value, 1.485 Å, while the $GeH_2$ moiety exhibits a slightly longer Ge—H bond (1.542-1.548 Å) than in a $GeH_3$ terminal group, as expected. Due to its unique structure the i-Si(SiGeGe) isomer possesses both terminal $SiH_3$ and $GeH_3$ groups and a single SiH moiety. Here the Ge—H bond lengths associated with the terminal $GeH_3$ groups have the same value (1.539 Å) as in GeH$_3$ groups of other isomers, while the corresponding terminal group Si—H$_3$ bond lengths are slightly contracted (1.483 Å). The longest Si—H bond length is associated with the central SiH moiety and has a value 1.488 Å. Collectively, these bond length trends are consistent with those found previously in the heaviest members of the (H$_3$Ge)$_N$SiH$_{4-N}$ (N=3,4) family of molecules.

The data presented in FIG. 12 also shows that the inter-metallic skeletal bond angles, as well as those involving hydrogen-metal bonds, are essentially unchanged between all isomers studied. The only exception is found in the H—Ge—Si bond distributions, which possess several values in the linear n-GeSiSiGe isomer and a unique value in all of the others. The Ge—Si—Si—Ge bond torsion in the linear molecules is 180°, indicating that the metal atoms are confined to a common plane, while the gauche conformations exhibit torsion angles of 66° and 64° in Ge—Si—Si—Ge and Ge—Si—Ge—Ge, respectively. It is also evident from the data that the inter-metallic and metal-hydrogen bond lengths in the i-Si(SiGeGe) isomer are, on average, closer to ideal tetrahedral values than those predicted for the other conformational/positional isomers.

FIG. 12 also lists the thermochemical energies of the molecules, including the total ground state electronic energy $E_0$, and its value corrected for zero point energy correction ($E_{ZPE}$), thermal energy ($E_{CORR}$), enthalpy ($H_{CORR}$) and free energy ($G_{CORR}$) at 298K. In the case of the Ge$_2$Si$_2$H$_{10}$ molecules our calculations indicate that i-Si(SiGeGe) isomer is slightly favored at room temperature, with a free energy difference of 0.0008 Hartree or about 2.0 kJ/mol (note: $k_B$T @ 300K~2.4 kJ/mol) relative to n-GeSiSiGe. The latter molecule's free energy is, in turn, more stable than that of g-GeSiSiGe by about 2.8 kJ/mol. For the GeSiGeGe impurity compound the n-GeSiGeGe isomer free energy is lower than that of its gauche conformation by 0.0020 Hartree (5.3 kJ/mol).

Vibrational spectra: In order to facilitate the interpretation of the observed FTIR spectra we calculated the vibrational frequencies and intensities of the conformational isomers n-GeSiSiGe and g-GeSiSiGe, and positional isomer i-Si(SiGeGe) of the primary product, as well as those of the minor species n-GeSiGeGe and g-GeSiGeGe, using the B3LYP DFT functional at the B3LYP/6-311G++(3df,2pd) level. No symmetry was imposed in the calculation of the frequency spectra and all molecules studied exhibited a positive definite spectrum of harmonic frequencies indicating that the ground state structures are dynamically stable.

Figure 2:
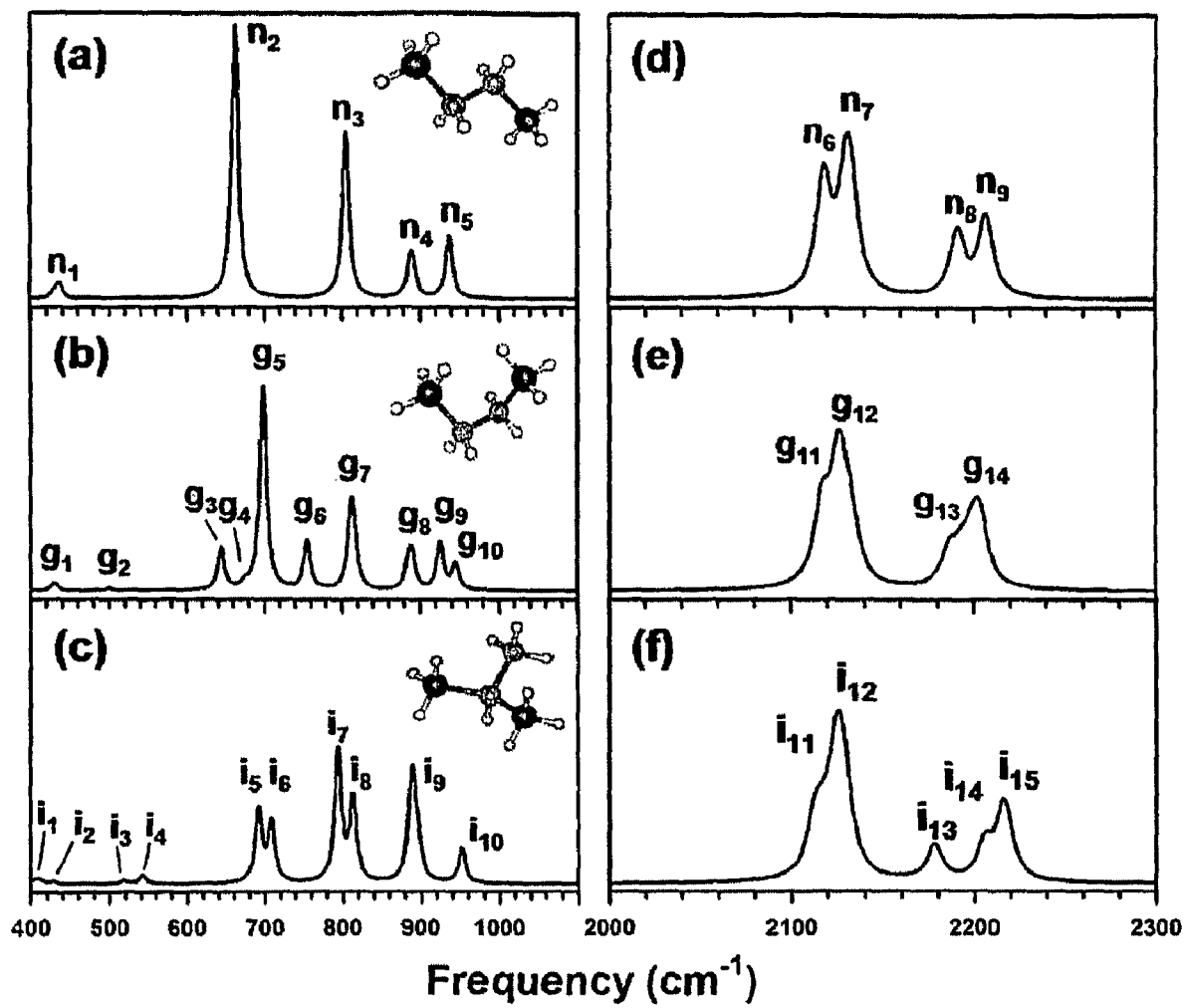
FIG. 2: Calculated IR spectra of n-GeSiSiGe, g-GeSiSiGe, and i-Si(GeSiSi). The low- and high-frequency range is shown in panels {(a),(b),(c)} and {(d),(e),(f)}, respectively. Empirical frequency scaling has not been applied to the spectra shown here. Individual spectral features of the n-GeSiSiGe, g-GeSiSiGe and i-Si(GeSiSi) molecules are labeled with "n", "g" and "i", respectively. Corresponding molecular structures are drawn as insets in the low-frequency plots.

Ge$_2$Si$_2$H$_{10}$ molecules: FIG. 2 shows plots of the calculated spectra of n-GeSiSiGe, g-GeSiSiGe and i-Si(SiGeGe), convoluted with a Gaussian of width ~20 cm$^{-1}$ to simulate experimental broadening. Both the high- and low-frequency regions are shown. It should also be noted that frequency scaling typically employed to reconcile the slight frequency overestimates obtained using this level of theory, has not been applied to the calculated spectra shown in these plots. The interpretation of the high-frequency spectral features (FIG. 2) is straightforward: the lower frequency pairs of peaks designated n$_6$ and n$_7$ in n-GeSiSiGe (FIG. 2(d)), g$_{11}$ and g$_{12}$ in g-GeSiSiGe (FIG. 2(e)), and i$_{11}$ and i$_{12}$ in i-Si(SiGeGe) (FIG. 2(f)), correspond to symmetric and anti-symmetric Ge—H stretching vibrations, respectively. Similarly, the symmetric and anti-symmetric Si—H stretching vibrations are designated n$_8$ and n9 in n-GeSiSiGe (FIG. 2(d)), g$_{13}$ and g$_{14}$ in g-GeSiSiGe (FIG. 2(e)), and i$_{14}$ and i$_{15}$ in i-Si(SiGeGe) (FIG. 2(f)), respectively. The calculated splitting (13-14 cm$^{-1}$) between the symmetric and anti-symmetric bands (in either Si—H or Ge—H) is approximately the same in all isomers, however, all of these bands are systematically lower (~4-5 cm$^{-1}$) in frequency in the gauche isomer. In addition to these features the high-frequency spectrum of the positional isomer i-Si(SiGeGe), shown in FIG. 2(f), also exhibits an isolated vibrational feature near 2077 cm$^{-1}$ (designated by i$_{13}$ in FIG. 2(f)), which corresponds to the central Si—H stretching vibration.

The low-frequency non-skeletal vibrational structure, also shown in FIG. 2, is considerably more complex and involves in- and out-of-plane, symmetric and antisymmetric Si—H/Ge—H wagging vibrations. The most striking difference between the spectra of n-GeSiSiGe and g-GeSiSiGe (parts (a) and (b) of FIG. 2, respectively) is that four distinct features (n$_2$-n$_5$) of the linear isomer are effectively split in its gauche counterpart. For example, the strongest band in n-GeSiSiGe, n$_2$, corresponding to highly symmetric Si—H wagging vibrations parallel with the molecular backbone, is split into three bands denoted by g$_3$, g$_5$ and g$_6$ in the gauche isomer exhibiting very strong Si—H wagging parallel to the Si—Si bond. Among these g$_5$ involves the least "crowded" protons in the molecule and accordingly exhibits the greatest intensity. The weak shoulder indicated by g$_4$ in the g-GeSiSiGe spectrum is the anti-symmetric counterpart to mode g$_5$. Finally, the distinct feature near 925 cm$^{-1}$ in the n-GeSiSiGe, n$_5$, corresponds to Si—H wagging vibrations perpendicular to the Si—Si axis involving symmetric H—Si—H bending motion. In the gauche isomer this band is split into symmetric and anti-symmetric counterparts denoted by g$_9$ and g$_{10}$. Only a few bands appear to be common to both isomers. In particular features (n$_1$:g$_1$) near 430 cm$^{-1}$ (asymmetrical wagging of the terminal Ge—H protons), (n$_3$:g$_7$) near 800 cm$^{-1}$ (symmetrical terminal Ge—H wagging parallel to the Si—Si bond) and (n$_4$:g$_8$) near 876 cm$^{-1}$ (terminal Ge—H wagging perpendicular to the Si—Ge bonds). The weak band designated g$_2$ in the FIG. 2(b) involves symmetrical terminal Ge—H wagging, and has a silent counterpart in the n-GeSiSiGe molecule.

The low-frequency spectrum of i-Si(SiGeGe), shown in FIG. 2(c), has a slightly simpler structure due the molecule's higher symmetry. The lowest frequency wagging modes found in the g-GeSiSiGe {g$_1$, g$_2$} are effectively split into asymmetrical pairs {i$_1$,i$_2$}, and {i$_3$,i$_4$}, respectively, in i-Si(SiGeGe). The dominant features near 800 cm$^{-1}$ (i$_7$ and i$_8$) correspond to in-phase and anti-phase symmetrical Ge—H wags of the terminal GeH$_3$ groups while feature i$_9$ is the asymmetrical analog to these vibrations. In the SiH$_3$ terminal group the Si—H wagging vibrations (i$_{10}$) occur at ~951 cm$^{-1}$. Finally, features i$_5$ and i$_6$ are unique to the i-Si(SiGeGe) molecule, and involve perpendicular Si—H wags of the SiH moiety.

Figure 3:
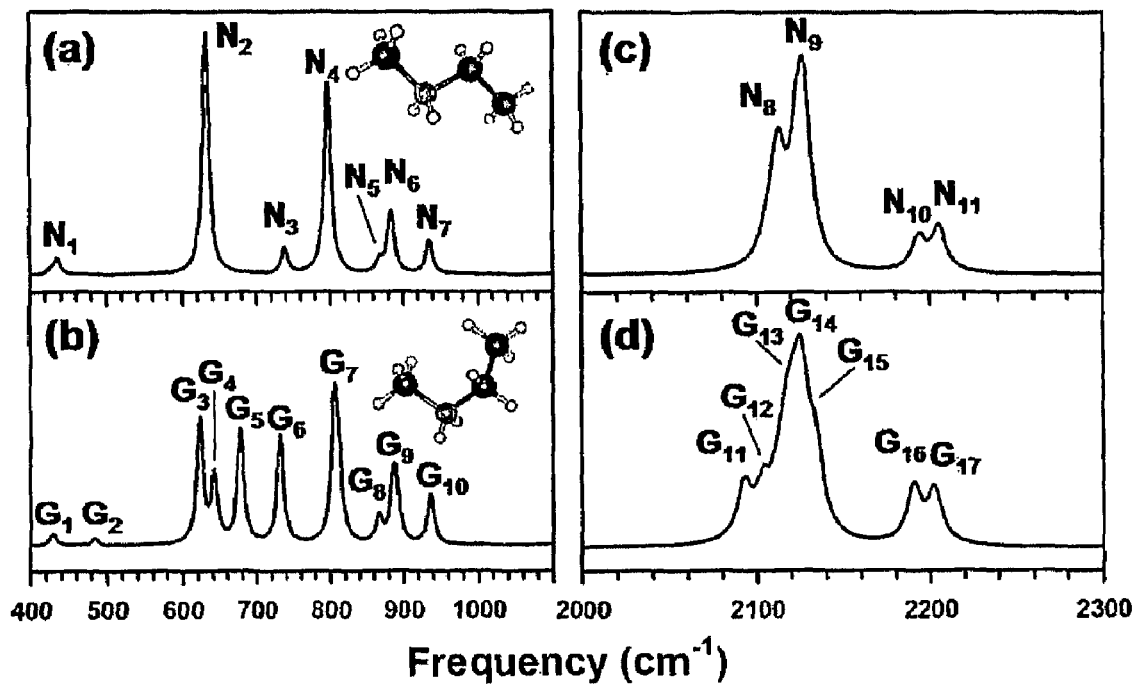
FIG. 3: Calculated IR spectra of n-GeSiGeGe and g-GeSiGeGe. The low- and high-frequency range is shown in panels {(a),(b)} and {(c),(d)}, respectively. The spectral features of the n-GeSiGeGe and g-GeSiGeGe isomers are labeled "N" and "G", respectively. Empirical frequency scaling has not been applied to the spectra shown here. Corresponding molecular structures are drawn as insets in the low-frequency plots.

SiGe$_3$H$_{10}$ molecules: For the n- and g-(GeH$_3$)$_2$(SiH$_2$GeH$_2$) isomers we corroborate the NMR characterization by directly comparing the observed IR spectrum with that calculated for a ~1:3 mixture of n-GeSiGeGe and g-GeSiGeGe conformations (a detailed explanation is given in the following section). The calculated IR spectra for both the n- and g-isomer, convoluted with a Gaussian of width ~20 cm$^{-1}$ to simulate experimental broadening, are given in FIG. 3. Both the high- and low-frequency regions are shown (no frequency scaling has been applied). Peaks in the simulated spectrum originating from n-GeSiGeGe or g-GeSiGeGe conformations are denoted by N$_i$ and G$_i$, respectively.

The high-frequency Si—H stretching bands are similar to those found in the GeSiSiGe analogs, exhibiting calculated splitting of 13-14 cm$^{-1}$ between the symmetric and anti-symmetric bands and a systematic overall ~4-5 cm$^{-1}$ shift to lower frequency in the gauche isomer. Here (N$_{11}$:G$_{17}$) and (N$_{10}$:G$_{16}$) correspond to asymmetric and symmetric Si—H stretches, respectively. However, a simple comparison for corresponding Ge—H stretching vibrations for these isomers is vitiated by the lower symmetry of GeSiGeGe isomers. For example the asymmetrical Ge—H stretch ($N_9$) in n-GeSiGeGe is split into contributions $G_{12}$, $G_{14}$ and $G_{15}$ in the gauche isomer while the symmetric Ge—H stretch, $N_8$ in the n-GeSiGeGe, is split into bands $G_{11}$ and $G_{13}$.

In the low-frequency range of the spectrum we find a strong correspondence between mode assignments of the n- and g-isomers above 700 cm$^{-1}$. Specifically, the asymmetrical H—Si—H wagging vibrations $N_3$ in n-GeSiGeGe appears as $G_6$ in g-GeSiGeGe, with a frequency near 731 cm$^{-1}$. As in our earlier discussion we designate such corresponding pairs between isomer conformations as ($N_3$:$G_6$). Intense Ge—H wagging vibrations ($N_4$:$G_7$) associated with terminal GeH$_3$ groups appear near 808 cm$^{-1}$. Similarly, H—Ge—H "scissor" modes at 866 cm$^{-1}$ are designated as ($N_5$:$G_8$), while their H—Si—H counterparts ($N_7$:$G_{10}$) appear at 936 cm$^{-1}$ (the frequency of the corresponding mode in the GeSiSiGe isomers was ~925 cm$^{-1}$). The features denoted ($N_6$:$G_9$) consist of asymmetrical "scissor"-like vibrations associated with the terminal GeH$_3$ groups.

The most significant differences between the IR spectra of the n- and g-isomers are found below 700 cm$^{-1}$. The most intense spectral feature in n-GeSiGeGe ($N_2$) is associated with a highly symmetric wagging of the protons bound to the GeH$_2$ moiety parallel to the molecular backbone. In the gauche isomer this mode is split into three features denoted $G_3$, $G_4$ and $G_5$, corresponding to asymmetrical Ge—H wagging of combinations of individual protons in the GeH$_2$ moiety. Finally, the mode N, in the n-isomer, consisting of concerted symmetrical wagging of terminal GeH$_3$ protons at both ends of the molecule, is split into two modes $G_1$ and $G_2$ in the gauche isomer in which symmetrical wagging occurs independently in the two GeH$_3$ terminal groups.

Figure 4:
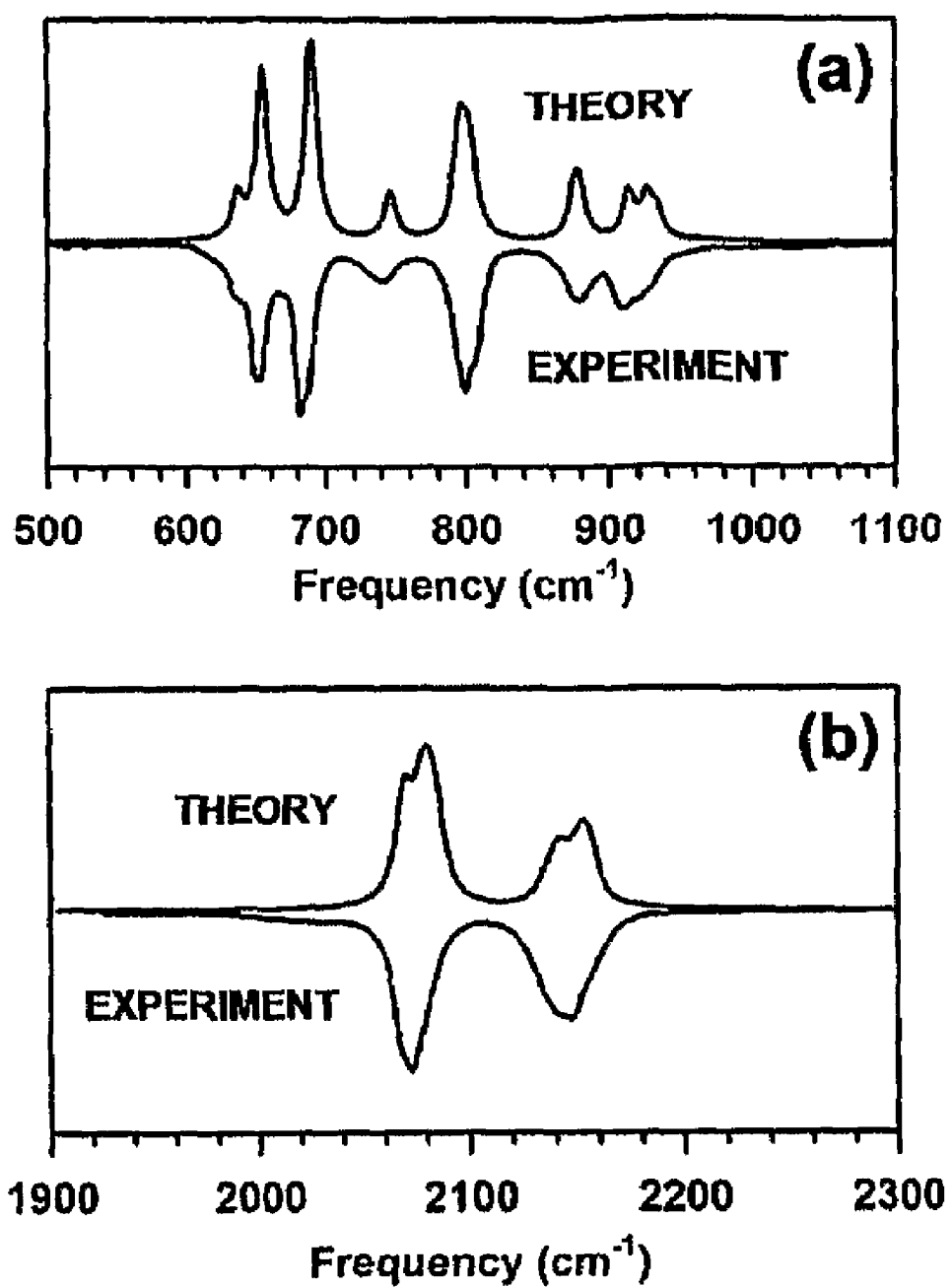
FIG. 4: Comparison of an experimental spectrum of (GeH$_3$)$_2$(SiH$_2$)$_2$ (1) with a superposition of theoretical spectra for the {n-GeSiSiGe, g-GeSiSiGe} combination: (a) low-frequency region (500-1100 cm$^{-1}$) and (b) high-frequency Si—H/Ge—H region (1900-2300 cm$^{-1}$). Frequency scale factors of 0.984 and 0.975 have been applied to the theoretical spectra in low- and high-frequency regions, respectively. The theoretical spectra consist of an admixture of 39% n-GeSiSiGe and 61% g-GeSiSiGe.

Isomer Admixture Analysis: To estimate the molar concentration of the conformational and positional isomers in the observed spectra, we adopt an approach commonly employed in "multi-phase" fitting of x-ray spectra, in which a normalized admixture of known pure-phase candidate spectra is fitted to an unknown observed spectrum of the combined molecules. Using the same procedures as in our prior studies on Si—Ge hydrides we have calculated the spectra of 10 digermyl-disilyl positional/conformational isomers (to be described elsewhere). These calculated spectra serve as a proxy for the unknown pure isomer candidate spectra normally supplied by experiment. A comparison of our calculated spectra with that of the synthesized compounds suggests the presence of simple admixtures of conformational {n-GeSiSiGe, g-GeSiSiGe} and positional {i-Si(SiGeGe), g-GeSiSiGe} isomers for the Si$_2$Ge$_2$H$_{10}$ family. To proceed with the analysis all of the required theoretical spectra (n-, g- and iso-isomers, see FIG. 2) are first calculated on a fine frequency grid (1 cm$^{-1}$ spacing), and then partitioned into low-frequency (0-1600 cm$^{-1}$) and high-frequency (1600-2600 cm$^{-1}$) regions. We denote the low-frequency spectra of the {n-GeSiSiGe, g-GeSiSiGe} pair by {$I_n(\omega)$, $I_g(\omega)$} and those of {i-Si(SiGeGe), g-GeSiSiGe} by {$I_i(\omega)$, $I_g(\omega)$}. The corresponding observed spectrum of the synthesized compound, $I_{exp}(\omega)$, produced on a discrete frequency grid {$\omega_k$} by the spectrometer, is then used to construct an objective function (Eq 9). For example, in the case of the {n-GeSiSiGe, g-GeSiSiGe} admixture:

$$O(\beta, \gamma, \eta) = \sum_k \{I_{exp}(\omega_k) - \beta[\gamma I_n(\eta\omega_k) + (1-\gamma)I_g(\eta\omega_k)]\}^2 \qquad (9)$$

where $\gamma$ is the normalized admixture of n- and g-spectra, $\beta$ is the global amplitude of the theoretical spectrum and $\eta$ is the common frequency scale factor applied to the theoretical spectra. An identical procedure is used to treat the {i-Si (SiGeGe), g-GeSiSiGe} combination. In all cases the theoretical spectra were evaluated at arbitrary frequencies using cubic splines, and a robust simplex method was used to minimize the objective function. For the {n-GeSiSiGe, g-GeSiSiGe} pair this yields a scale factor of $\eta$=0.984 and an admixture of $\gamma$=0.392 (i.e., ~39% n-GeSiSiGe). This optimized scale factor is very similar to the value 0.989 used in previous studies of the (H$_3$Ge)$_x$SiH$_{4-x}$ hydrides[7] and Si$_2$H$_6$, Ge$_2$H$_6$ and H$_3$GeSiH$_3$ molecules[12] at this level of theory. As shown in FIG. 4(a) the resulting low-frequency composite theoretical spectrum ($\omega$<1600 cm$^{-1}$), generated using this scale factor, agrees remarkably well with the observed one. To simulate the composite high-frequency spectrum for {n-GeSiSiGe, g-GeSiSiGe} we employ the admixture parameter derived from low-frequency behavior, $\gamma$=0.392, and reduce the scale factor to $\eta'$=(0.9909$\eta$)=0.975. This low-to high-frequency scale factor ratio was previously found to yield an excellent account of the scaling behavior in related molecules[12]. FIG. 4(b) demonstrates that the optimized parameters obtained using fits to the low-frequency spectra also faithfully and independently reproduce the high-frequency behavior, confirming the integrity of our procedure. Application of the foregoing low-frequency analysis to the positional isomeric combination {i-Si(SiGeGe), g-GeSiSiGe} yields $\eta$=0.985 and $\gamma$=0.678 (i.e., ~68% i-Si (SiGeGe). The sample spectrum is compared with the calculated admixture in FIG. 5, which indicates that the vibrational structure is largely accounted for using the admixture procedure.

Figure 6:
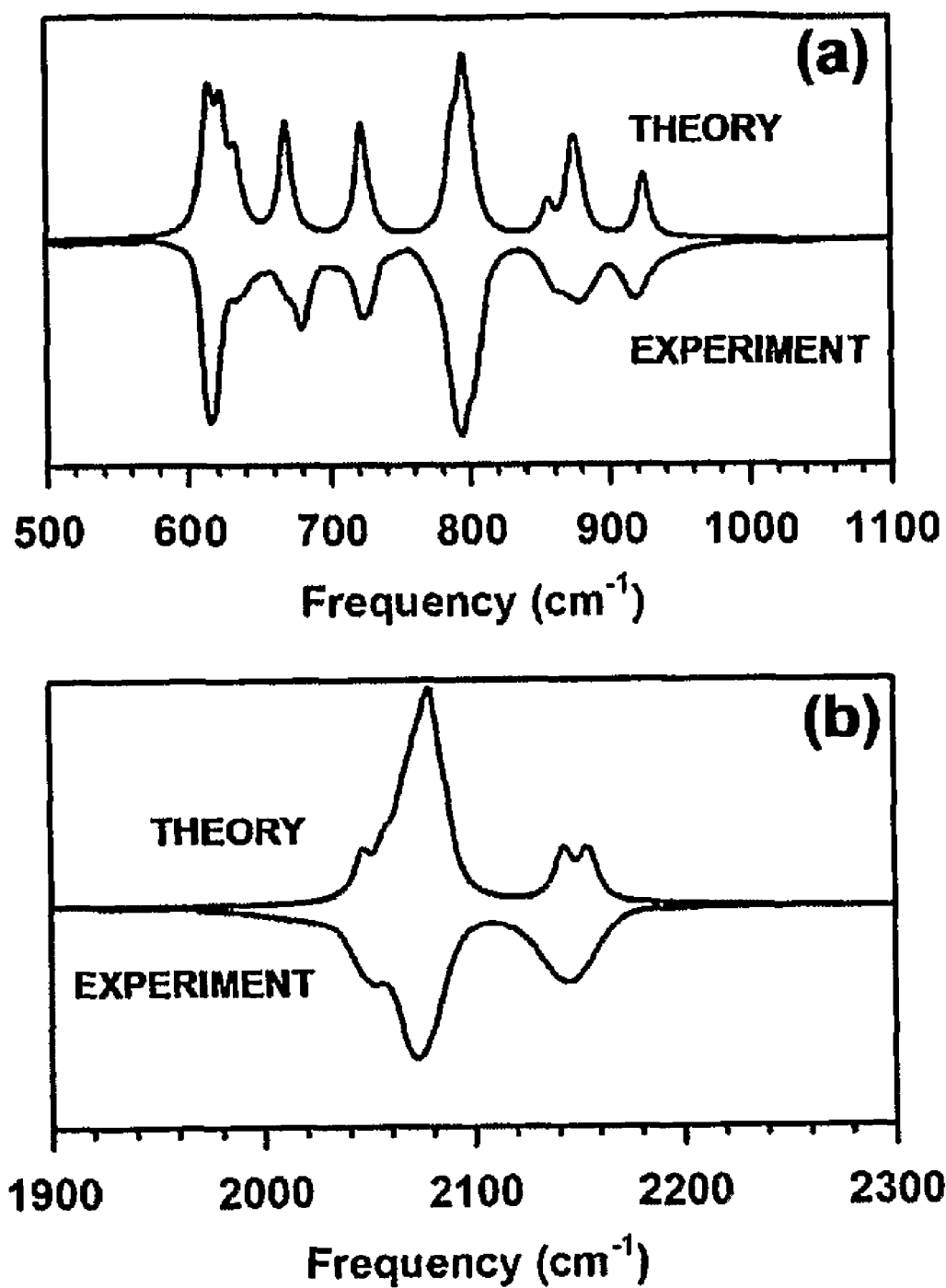
FIG. 6: Comparison of an experimental spectrum of (GeH$_3$)$_2$(SiH$_2$GeH$_2$) (3) with a superposition of theoretical spectra for the {n-GeSiGeGe, g-GeSiGeGe} combination: (a) low-frequency region (500-1100 cm$^{-1}$) and (b) high-frequency Si—H/Ge—H region (1900-2300 cm$^{-1}$). Frequency scale factors of 0.985 and 0.976 have been applied to the theoretical spectra in low- and high-frequency regions, respectively. The theoretical spectra consist of an admixture of 23% n-GeSiGeGe and 77% g-GeSiGeGe.

The corresponding results for the GeSiGeGe impurity compound are shown in FIG. 6. A completely analogous fitting procedure to that above yields, in this case, an admixture parameter $\gamma$=0.235 (i.e., 23.5% n-GeSiGeGe) indicating that the gauche conformation (g-GeSiGeGe) is dominant in the gas phase. As in the GeSiSiGe analysis, we find that fitting parameters obtained from the low-frequency spectrum ($\omega$<1600 cm$^{-1}$) yields an excellent account of the high-frequency stretching bands using the reduced frequency scale factor 0.975 (FIG. 6(b)).

Figure 7:
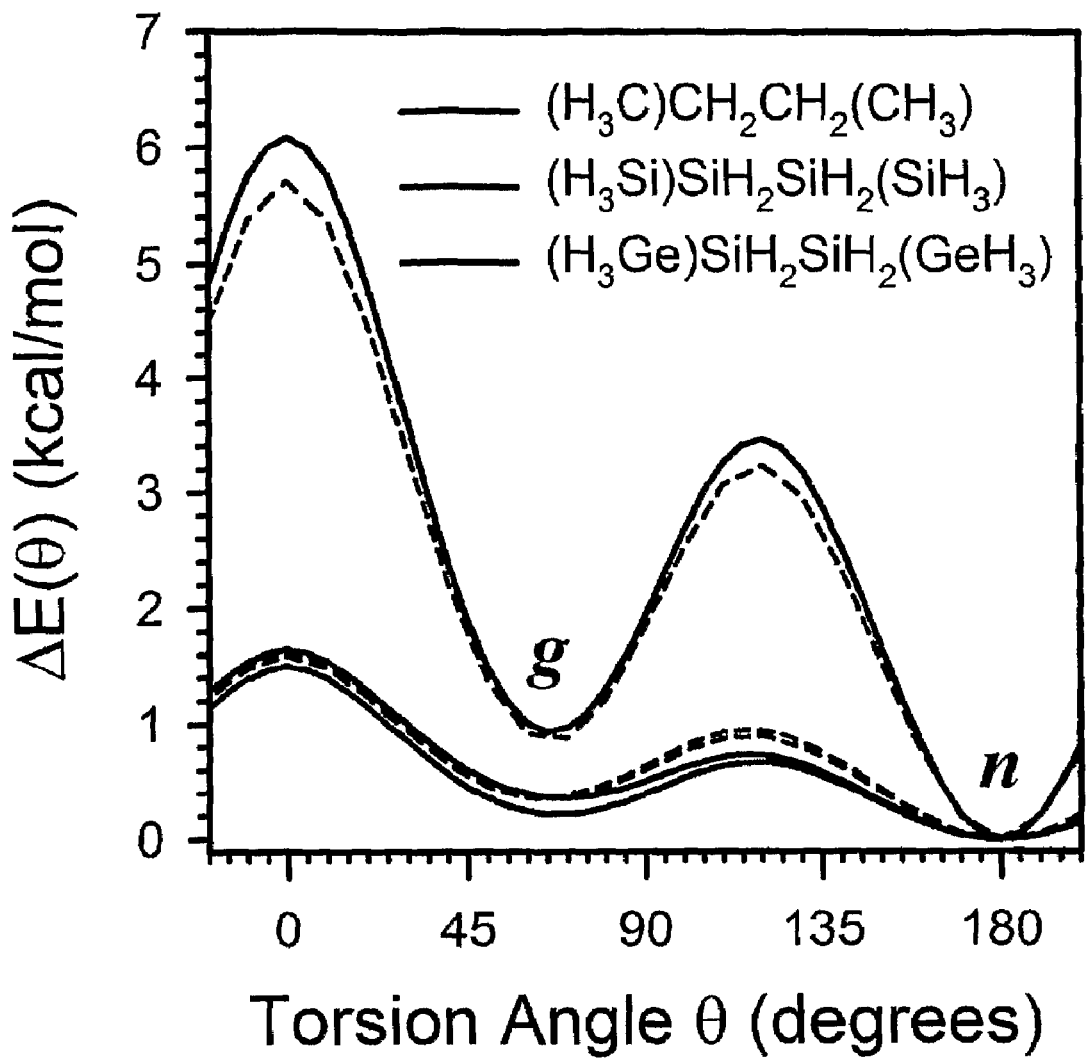
FIG. 7: Relaxed potential energy surface of as a function of the molecular backbone torsion angle for butane (black), tetrasilane (red) and GeSiSiGe (blue). Solid and dashed lines correspond to CCSD/LANL2DZ and B3LYP/6-311G++(3df,2pd) calculations, respectively.

We have observed that the proportions derived for the conformational isomers are essentially constant between different samples. To elucidate this observation we calculated the potential energy surface (PES) of the butane-like GeSiSiGe as a function of the Ge—Si—Si—Ge backbone torsion angle. The linear conformation corresponds a torsion angle of 180° while the gauche modification occurs at ~66° (see FIG. 12). For each fixed value of the torsion angle all remaining structural degrees of the freedom are optimized resulting in a "relaxed" PES. FIG. 7 compares the torsional PES for butane, tetrasilane and GeSiSiGe at the DFT B3LYP/ 6-311G++(3df,2pd) and ab initio CCSD/LANL2DZ levels of theory. In all cases the value of the linear or trans-configuration is chosen as the reference energy. The plots reveal that all three molecules exhibit very similar energy-torsion profiles with a global minimum at 180°, a n-g barrier ($E_{n-g}$) at ~120°, a local minimum at the gauche configuration ($E_g$) near 66° and a maximum value corresponding to the eclipse saddle point ($E_e$). Using the DFT B3LYP/6-311G++(3df,2pd)

description we obtain $\Delta E_{n-g}$=0.942, $\Delta E_g$=0.362 and $\Delta E_e$=1.628 kcal/mol for GeSiSiGe, while the corresponding tetrasilane values are 0.895, 0.360 and 1.591 kcal/mol, respectively. At this level of theory the conformational energy structure of GeSiSiGe and butane-like tetrasilane is essentially identical. This is not unexpected in view of their very similar bond character. At the same level of description we find that the analogous PES for butane shares the same qualitative form as that of tetrasilane and GeSiSiGe, but with significantly larger rotational barriers $\Delta E_{n-g}$=3.235, $\Delta E_g$=0.884 and $\Delta E_e$=5.713 kcal/mol.

It should be noted that our B3LYP/6-311G++(3df,2pd) tetrasilane values for $\Delta E_{n-g}$ and $\Delta E_e$ are qualitatively different from those calculated by Albinsson et al[13] at the MP2/6-31* level for the same molecule. In particular the latter authors predict a symmetric n-g barrier and a near identity of gauche and linear conformation energy ($\Delta E_{n-g}$~0.588, $\Delta E_g$, ~−0.04 and $\Delta E_e$~1.236 kcal/mol). Unfortunately, because the basis set levels and model chemistries in our two approaches both differ, the origin of this discrepancy is ambiguous. We therefore carried out a series of coupled cluster calculations at the CCSD/LANL2DZ level for the sequence butane, tetrasilane and GeSiSiGe. The results, shown as solid lines in FIG. 7, are remarkably consistent with the B3LYP-based DFT calculations (dashed lines in the figure), and indicate that the linear butane-like conformation is the ground state structure, with a gauche value of $\Delta E_g$~0.2-0.4 kcal/mol. Furthermore, the magnitude of the barrier connecting the gauche and linear conformations in GeSiSiGe is reduced to 0.36 kcal/mol (~188 K) in the CCSD/LANL2DZ calculations. This small value of the torsional barriers in tetrasilane and GeSiSiGe is consistent with the facile low-temperature conformational interconversions observed experimentally.

Figure 5:
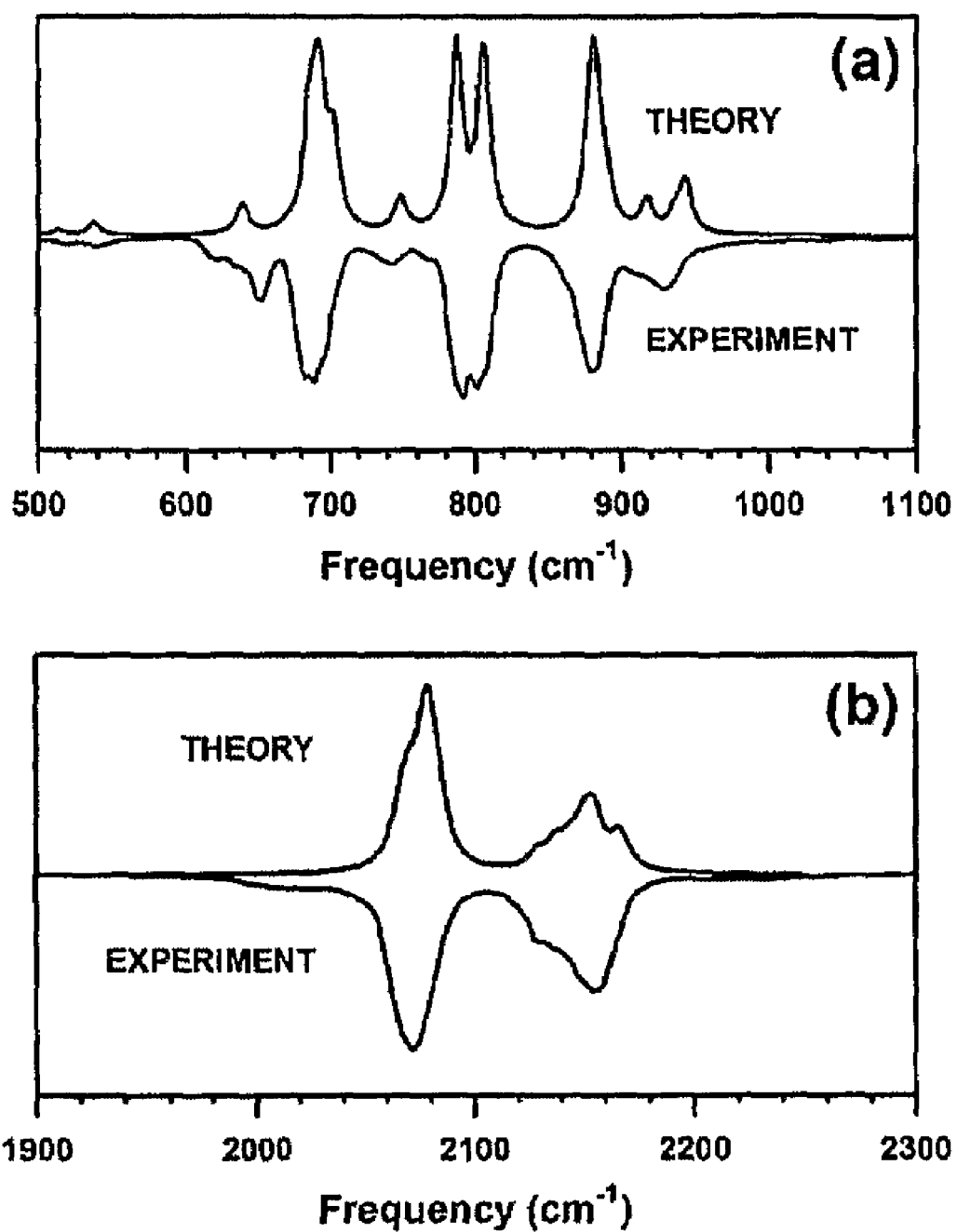
FIG. 5: Comparison of an experimental spectrum of a mixture (GeH$_3$)$_2$(SiH$_2$)$_2$ (1) with a superposition of theoretical spectra for the {i-Si(GeSiSi), g-GeSiSiGe} combination: (a) low-frequency region (500-1100 cm$^{-1}$) and (b) high-frequency Si—H/Ge—H region (1900-2300 cm$^{-1}$). Frequency scale factors of 0.985 and 0.976 have been applied to the theoretical spectra in low- and high-frequency regions, respectively. The theoretical spectra consist of an admixture of 68% i-Si(GeSiSi) and 32% g-GeSiSiGe.

It should be noted that the 68% value obtained for the positional isomeric spectrum, shown in FIG. 5, is characteristic of one particular sample. Unlike the conformational isomers, which exhibited a constant proportion between samples, the proportions of the positional isomers sensitively depend on the specific reaction conditions. This suggests that once the {i-Si(SiGeGe), g-GeSiSiGe} mixture has been isolated no inter-conversion between positional isomers occurs. Chain cleavage and spontaneous isomerization are observed in the closely related tetrasilane $Si_4H_{10}$ system during photochemical matrix isolation experiments producing trisilane ($Si_3H_8$) and silylene ($SiH_2$).[13] The formation i-$Si_4H_{10}$ observed as a mixture with n-$Si_4H_{10}$ is then believed to follow from $SiH_2$ insertion into the Si—H bonds of trisilane. As discussed in detail by Jasinski et al. this insertion reaction is one of the characteristic mechanisms in gas phase polysilane chemistry, possessing a slight negative activation energy and a very high collisional efficiency.[14] We surmise that an analogous low energy germylene insertion reaction channel is present in our synthesis route (see Eq. 2) involving the triflate-substituted disilanes at T>22° C., leading to the condensation of i-Si(SiGeGe). One plausible mechanism could involve the replacement of —$SO_3CF_3$ by $GeH_3$ at the 1-substitution site of $(SO_3CF_3)_2(SiH_2)_2$ (5), followed by insertion of $GeH_2$ in the Si—H bonds of the central $SiH_2$ site in the —$SiH_2$—$SiH_2$—$GeH_3$ intermediate.

Deposition Studies

The deposition experiments were conducted on a clean Si(100) substrates in ultra-high vacuum system equipped with a low energy electron microscope (LEEM) that allowed in situ real time observation of the growth process. The $(H_3Ge)_2(SiH_2)_2$ gaseous precursor reacted on the Si surface via complete $H_2$ elimination at partial pressures in the range of $10^{-5}$-$10^{-8}$ Torr. Initially, the reaction growth kinetics was investigated using LEEM and the activation energy ($E_{act}$) of the compound with respect to $H_2$ desorption from the Si surface was measured. It is known that for conventional silanes and germanes the $E_{act}$ is much lower on a Ge containing surface (including $Si_{1-x}Ge_x$) than on pristine Si. Thus, an accurate determination of $E_{act}$ can only be obtained from measuring the growth rate of the first monolayer, (which grows directly on pure Si) and not that of subsequent layers, which grow on Ge containing surfaces and have higher growth rates. In this regard LEEM is particularly unique because its dynamic imaging differentiates the Si(001)-(2x1) surface from the $Si_{1-x}Ge_x$ epilayer and thus provides unambiguous means for the correct determination of $E_{act}$ on Si by measuring the growth rate of the first $Si_{1-x}Ge_x$ monolayer vs. temperature.

Figure 8:
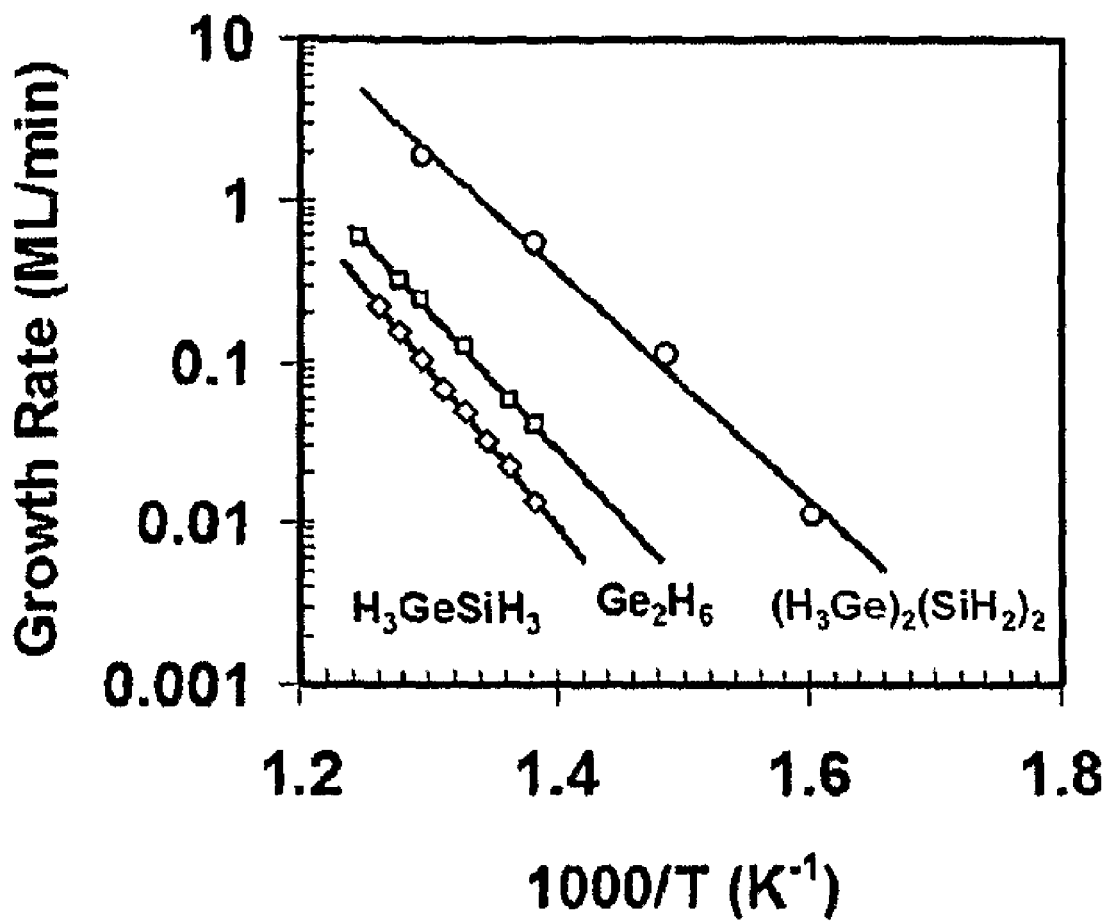
FIG. 8: Temperature dependence of the first layer growth rates for thee precursors: H$_3$GeSiH$_3$, Ge$_2$H$_6$ and (H$_3$Ge)$_2$(SiH)$_2$ (1). The activation energies for these compounds are 1.95, 1.66 and 1.42 eV, respectively.

For comparison the growth rates of $Ge_2H_6$ and $H_3GeSiH_3$ were also determined using the same method. For these and for $H_3Ge)_2(SiH_2)_2$ the first monolayer took longer to complete on pristine Si than subsequent monolayers. FIG. 8 is a graph showing plots of the temperature dependence of the first layer growth rates. The activation energies were determined using the relation R~exp(−$E_a$/kT). The data are consistent with the first-order $H_2$ desorption kinetics and yield $E_{act}$ of 1.95, 1.66 and 1.42 eV, for $H_3GeSiH_3$, $Ge_2H_6$ and $(H_3Ge)_2(SiH_2)_2$, respectively. This indicates that the latter it is not only more reactive than $H_3GeSiH_3$, but is also more reactive than pure $Ge_2H_6$ despite the presence of strong Si—H bonds in the molecular structure. Accordingly, it represents a unique high-reactivity species suitable for low temperature (300-400° C.) rapid growth of thick layers (100-500 nm) with stoichiometry $Si_{0.50}Ge_{0.50}$ reflecting that of the corresponding precursor. Below we describe the deposition procedure and key results regarding morphology, microstructure, composition and strain for the films.

Figure 9:
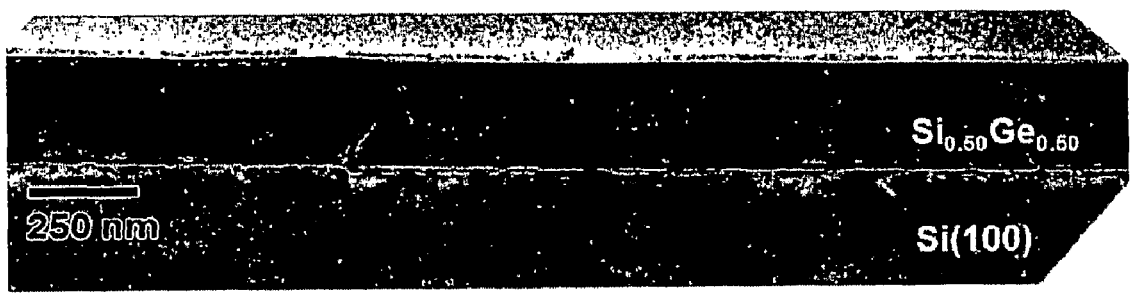
FIG. 9: XTEM micrographs of a Si$_{0.50}$Ge$_{0.50}$ layer grown on Si(100) at 350° C. No threading defects are observed within the field of view of ~2.50 □m, indicating a dislocation density of <10$^6$/cm$^2$.
Figure 10:
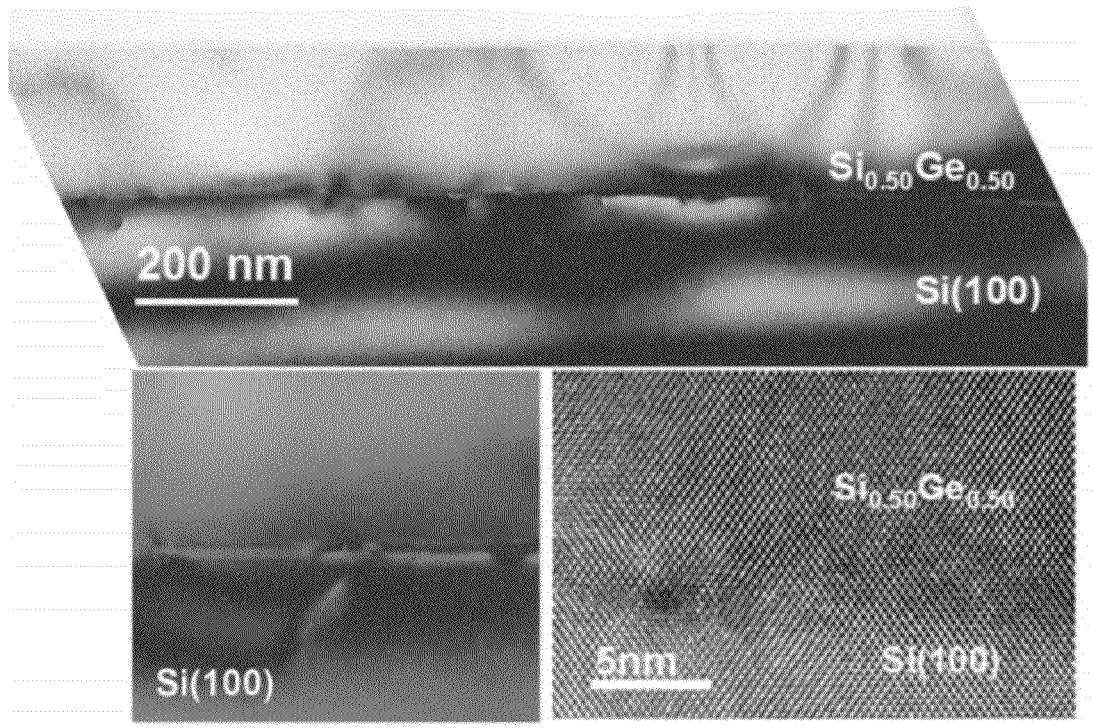
FIG. 10: Diffraction contrast, high resolution XTEM micrographs of a Si$_{0.50}$Ge$_{0.50}$ layer grown on Si(100) at 400° C. The film is nearly strain-free (~85%) and displays an atomically smooth surface, free of threading defects (top). The mismatch with Si(100) is accommodated by dislocations located at the interface (bottom left). Defects originating at the interface show the propensity to penetrate downward into the Si(100) substrate (bottom right).

The synthesis of $Si_{0.5}Ge_{0.5}$ films was investigated in the 350° C.-500° C. range via dehydrogenation of $(H_3Ge)_2(SiH_2)_2$. The highest temperature that yields planar layers is ~450° C. The growth rate is ~4 nm/min and decreases to 2 nm/min at 350° C. No appreciable growth was observed below 300° C. (1x$10^{-5}$ Torr) due to the reduced reactivity of the compound. Thick films with rough surfaces and defective microstructures were produced at 500° C. with growth rates as high as 15 nm/min. The composition and heteroepitaxial character of the films were investigated by random and channeling Rutherford backscattering (RBS), which in all cases indicate a highly stoichiometric material aligned with the substrate. The ratio of the aligned versus the random peak heights ($\chi_{min}$), which measures the degree of crystallinity, decreases from 15% at the interface to 6% at the surface indicating a dramatic reduction in dislocation density across the thickness of the film. This is confirmed by high resolution XTEM, which revealed commensurate SiGe/Si interfaces and perfectly monocrystalline layer microstructures. A survey of TEM samples showed no defects penetrating through the layers within a field of view of ~2.5 μm in the micrographs indicating an upper limit in the threading dislocation density of ~$10^6$/cm$^2$ (FIG. 9). Most of the defects due to the lattice mismatch are concentrated near the interface region. In fact, a number of these appear to originate at the SiGe/Si interface and show a propensity to propagate downward into the substrate (FIG. 9). Occasional edge dislocations spaced by ~150 nm are also observed in the vicinity of steps on the Si surface (FIG. 10). These are parallel to the interface plane and may provide stress relief between the film and the substrate. The presence of edge dislocations is unusual since SiGe-based materials typically display (111)-threading dislocations and stacking faults. X-ray diffraction (XRD) revealed highly aligned layers with mosaics spreads as low as 0.1 degrees and relatively strain free microstructures. Raman scattering experiments conducted with several Ar+ laser lines revealed a high degree of vertical uniformity in concentration and strain.[8] The Raman analysis indicated that the composition agrees well with the RBS value and that the strain relaxation is 75% and 95% for films with thickness of 200 and 500 nm, respectively which similar to those obtained by XRD.

Figure 11:
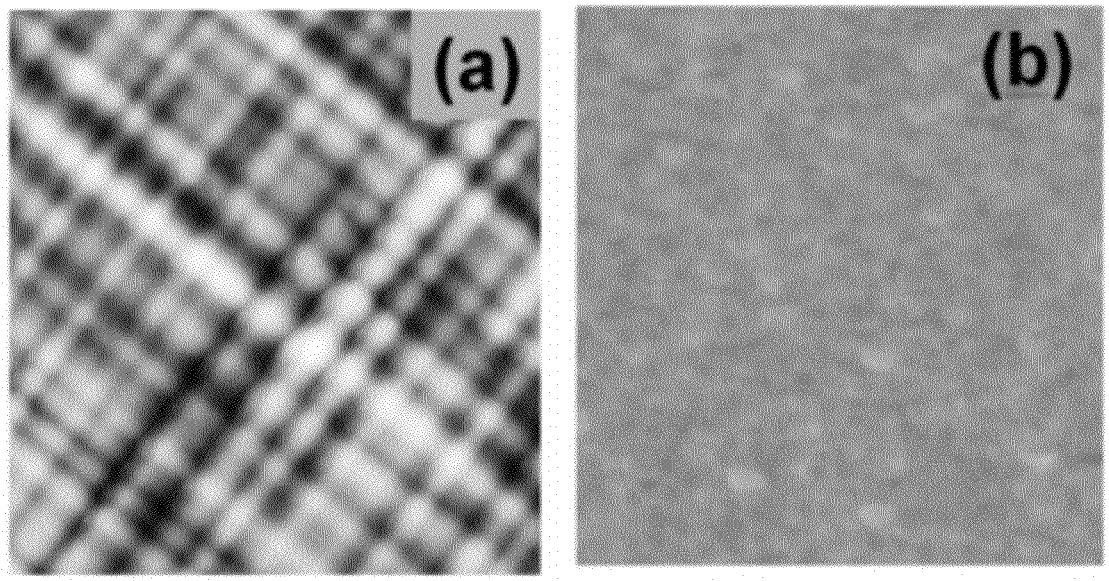
FIG. 11: (a) AFM image of Si$_{0.50}$Ge$_{0.50}$ on Si(100) showing the cross-hatch pattern morphology with an RMS roughness of 2.3 nm. (b) AFM image of a strain-relaxed and completely planar film with an RMS roughness of 0.5 nm.

Atomic force microscopy (AFM) studies show that films with thickness of 50 and 750 nm display RMS values of 0.5 and 1.5 nm, respectively, for 10×10 μm$^2$ areas, indicating highly planar surfaces for samples grown at T<450° C. as shown FIG. 11(*a*). For layers grown at T>450° C. the AFM images [FIG. 11(*b*)] show a classic "cross hatched" surface pattern caused by misfit dislocations produced during strain relaxation. It has been shown that both defect induced interface and bulk alloy scattering considerably reduces the electron mobilities in these samples and degrades the device performance.[15] Nevertheless conventional CVD at ultra low pressure is known to produce $Si_{1-x}Ge_x$ materials with significantly lower cross hatching patterns leading to higher quality electrical properties. In contrast to these methodologies, which typically involve low-order silanes and germanes ($SiH_4$, $Si_2H_6$, $GeH_4$, $Ge_2H_6$), the present route utilizes the highly reactive and more massive $(H_3Ge)_2(SiH_2)_2$ compound. The direct incorporation of the $Si_2Ge_2$ molecular unit into the film leads to low surface diffusion compared to the conventional low mass compounds. Furthermore, the high reactivity permits low growth temperature and promotes high growth rates at pressures of $\sim 10^{-5}$ Torr leading to device quality films devoid of cross hatched surface morphologies.

The thermal properties of the films were investigated between 450° C. and 750° C., a range well within device processing temperatures. The XRD lattice constant, the RBS $\chi_{min}$ values, and the AFM roughness were measured for the annealed samples and compared with the corresponding values of the as-grown materials. Samples with a thickness as low as 200 nm did not show any increase in surface roughness even after annealing at 750° C. indicating that the surface planarity of our samples is thermally robust. The XRD and RBS aligned spectra were essentially identical before and after annealing. This result also confirms full relaxation in the as-grown layers at T<450° C.

CONCLUSION

We have demonstrated the synthesis of the butane-like compounds with molecular formulas $(GeH_3)_2(SiH_2)_2$ (1) $(GeH_3)_2SiH(SiH_3)$ (2) and $(GeH_3)_2(SiH_2GeH_2)$ (3) and their conformational isomers. Detailed characterization of the products was conducted via a range of spectroscopic and analytical methods including quantum chemical simulations. A new fitting procedure was developed, based on the admixture of normal and gauche calculated spectra, to obtain the proportions of the individual conformers in the product sample at 22° C. Controlled depositions of (1) have produced stoichiometric SiGe films possessing the desired properties for semiconductor applications including perfectly crystalline and epitaxial microstructures, smooth morphologies, and uniformly strain-relaxed states. Unique practical advantages associated with this low temperature (~350-450° C.) rapid growth include: (i) short deposition times compatible with preprocessed Si wafers, (ii) selective growth for application in high frequency devices, and (iii) negligible mass segregation of dopants, which is particularly critical for thin layers. Finally we have found that these compounds are remarkably stable over extended periods of time, with evidence of decomposition, and thus represent viable molecular sources for potential industrial applications.

Experimental Section

All manipulations were carried out under inert conditions using standard Schlenk and drybox techniques. Dry, air-free solvents were distilled from either anhydrous $CaCl_2$ or sodium benzophenone ketyl prior to use. All NMR spectra were collected either on a Varian INOVA 400 spectrometer operating at 400 MHz or a Gemini 300 spectrometer. Samples were dissolved in $CDCl_3$ or $C_6D_6$ and all nuclei were referenced either directly or indirectly to the proton signal of TMS or the residual solvent peak as indicated. IR spectra were recorded using a 10 cm gas cell with KBr windows. Elemental analyses were performed by Desert Analytics (Tucson, Ariz.). Gas chromatography mass spectrometry (GCMS) data were obtained using a JEOL JMS-GC Mate II spectrometer. Powdered lithium (Aldrich), lithium tetrahydroaluminate (Aldrich), trichloro(p-tolyl)silane (Gelest), trifluoromethane sulfonic acid (Alfa Aesar), nonafluorobutane-1-sulfonic acid (Aldrich) and electronic grade germane gas (Voltaix, Inc.) were used as received. The starting materials p-tolylsilane, chloro(p-tolyl)silane, 1,2-bis(p-tolyl)disilane and 1,2-bis(trifluoromethylsulfonyloxy)disilane were prepared according to literature procedures and their purity checked by NMR spectroscopy. Potassium germyl was synthesized in monoglyme using sodium-potassium (80% K) alloy. The coupling reactions using powdered lithium were performed in a helium environment rather that in an $N_2$ atmosphere to prevent formation of lithium nitride.

$(p\text{-tolyl})_2(SiH_2)_2$. A solution of monochloro(p-tolyl)silane (10.0 g, 63.8 mmol) in di-n-butyl ether (120 mL) and toluene (40 mL) is stirred with sodium pieces (1.68 g, 146.2 mmol) for 5 h at 125° C. The mixture is filtered and the filtrate is distilled to remove the solvents and other impurities. The remaining colorless liquid product (4.40 g, ~60%) was examined by NMR to determine its identity and purity and was subsequently used without purification.

$(C_4F_9SO_3)_2(SiH_2)_2$: A sample of $C_4F_9SO_3H$ (7.9 g, 26.3 mmol) was added to a 15 mL solution of 1,2-(p-tolyl)disilane (3.18 g, 13.1 mmol) in toluene at −40° C. A colorless precipitate was immediately formed at low temperatures. The reaction flask was warmed to 23° C. and stirred for 1-2 h. The colorless solid was filtered and dried in vacuo. Repeated concentration and cooling of the toluene filtrate at −20° C. yielded additional product. Yield=7.9 g (95%). Mp=68° C. $^1$H NMR (300 MHz, $CDCl_3$): δ5.078 (s, $^1J_{SiH}$=272 Hz, Si—H$_2$, $^3J_{HH}$=3.6 Hz). $^{29}$Si NMR (79.5 MHz, $CDCl_3$): δ−30.1. Anal. Calcd for $C_8F_{18}S_2O_6Si_2H_4$: C, 14.59; H, 0.61; F, 51.95. Found: C, 14.27; H, 0.87; F, 51.74.

$(H_3Ge)_2(SiH_2)_2$, method A: A 20 mL solution of $(C_4F_9SO_3)_2(SiH_2)_2$ (4.67 g, 9.5 mmol) was added to a slurry of $KGeH_3$ (2.00 g, 20.9 mmol) in diethyl ether (15 mL), at −40° C. The reaction was then warmed to −10° C. and stirred under nitrogen for 12 h after which it was heated at 35° C. for an additional 1 h. The volatiles were fractionally distilled several times through U-traps held at −20, −50 and −196° C. The −50° C. trap retained pure $(H_3Ge)_2(SiH_2)_2$ (260 mg, 26% Yield) while the −196° C. trap contained solvent, and traces $GeH_4$ and $SiH_4$. Vapor pressure: 7.0 Torr (23° C.). IR (gas, cm$^{-1}$): 2147 (s), 2073 (vs), 910 (w), 879 (w), 799 (s), 740 (vw), 682 (s), 651 (m), 442 (vw). $^1$H NMR (400 MHz, $C_6D_6$, 7.15 ppm): δ 3.106 (t, J=4.1 Hz, 6H, Ge—H$_3$), δ 3.290 (q, J=3.9 Hz, 4H, $S_1$—H$_2$). $^{29}$Si NMR (79.5 MHz, $C_6D_6$): δ −105.0 (this value is close to that observed for $(H_3Ge)_2SiH_2$ at −102.45) GCMS: m/z 210-196 ($Si_2Ge_2H_x^+$), 180-170

($SiGe_2H_{8-x}^+$), 152-143 ($Ge_2H_{6-x}^+$), 140-126 ($Si_2GeH_{8-x}^+$), 107-98 ($H_3SiGeH_3^+$), 77-72 ($GeH_4^+$), 62-58 ($Si_2H_{6-x}^+$), 32-28 ($SiH_4^+$).

($H_3Ge)_2(SiH_2)_2$, method B: A sample of $(CF_3SO_3)_2(SiH_2)_2$ (3.39 g, 9.5 mmol) was added to a slurry of 2.40 g (20.9 mmol) of $KGeH_3$ in diethyl ether (30 mL) at −30° C. The mixture was then warmed to 23° C. and stirred under nitrogen for 5 h. The volatiles were fractionally distilled and the $(H_3Ge)_2(SiH_2)_2$ product in its pure form was collected at a −50° C. trap (0.250 g, ~13% yield).

$(SiH_2GeH_2)(GeH_3)_2$: The compound is obtained as a byproduct in the synthesis of $(H_3Ge)_2(SiH_2)_2$, and was isolated by repeated distillation through U-traps under static vacuum maintained at −20 and −50° C. to collect $SiH_2GeH_2(GeH_3)_2$ and $(H_3Ge)_2(SiH_2)_2$, respectively. Vapor pressure: 1.0 Torr (22° C.). IR (gas, cm$^{-1}$): 2145 (m), 2073 (vs), 910 (w), 878 (w), 793 (vs), 723 (w), 679 (w), 615 (s), 443 (vw). $^1$H NMR (400 MHz, $C_6D_6$, 7.15 ppm): (53.30 (sept, J=3.9 Hz, 2H, $S_1$—$H_2$), δ 3.23 (t, J=4.6 Hz, 3H, Ge—$H_3$), (3.13 (t, J=3.90 Hz, 3H, Ge—$H_3$), ±3.03 (sept, J=4.0 Hz, 2H, Ge—$H_2$). $^{29}$Si NMR (79.5 MHz, $C_6D_6$): δ −98.2. GCMS: m/z 256-240 ($SiGe_3H_{10-x}^+$), 230-212 ($SiGe_2H_{8-x}^+$), 184-169 ($SiGe_2H_{8-x}^+$), 154-141 ($Ge_2H_{6-x}^+$), 136-128 ($Si_2GeH_{8-x}^+$), 108-98 ($SiGeH_{6-x}^+$), 77-70 ($GeH_{4-x}^+$), 32-28 ($SiH_4^+$).

REFERENCES

1. Mooney, P. M.; Chu, J. O. *Annu. Rev. Mater. Sci.* 2000, 30, 335.
2. Tromp, R. M.; Ross, F. M. *Annu. Rev. Mater. Sci.* 2000, 30, 431.
3. Kuo, Y—H; Kyu, Y.; Ge, Y.; Ren, S.; Roth, J. E.; Kamins, T. I.; Miller, D. A. B.; Harris, J. S. Nature 2005, 437, 1334.
4. Lee, M. L.; Pitera, A. J.; Fitzgerald, E. A. *J. Vac. Sci. Technol.* 2004, B 22 (1), 158.
5. E. Kasper, S. Heim, *Appl Surf Sci.* 2004, 224, 3.
6. Currie, M. T.; Samavedam, S. B.; Langdo, T. A.; Leitz, C. W.; Fitzgerald, E. A. *Appl. Phys. Lett.* 1998, 72 (14), 1718.
7. Ritter, C. J.; Hu, C.; Chizmeshya, A. V. G.; Tolle, J.; Klewer, D.; Tsong, I. S. T.; Kouvetakis, J. *J. of the Am. Chem. Soc.* 2005, 127(27), 9855-9864.
8. Hu, C.-W.; Menendez, J.; Tsong, I. S. T.; Tolle, J.; Chizmeshya, A. V. G.; Ritter, Cole; Kouvetakis, J. Applied Physics Letters 2005, 87(18), 181903/1-3.
9. Nijhawan, S.; Mc Murry, P. H.; Swihart, M. T.; Suh, S-M; Girshick, S. L.; Campbell, J. E. Brockmann, S. A. *Aerosol Science* 2003, 34, 691-711.
10. Soldner, M.; Schier, A.; Schmidbaur, H.; J. Organometallic Chem. 1996, 521, 295.
11. *Gaussian* 03, revision C.02; Frisch, M. J.; Trucks, G. W.; Schlegel, H. B.; Scuseria, G. E.; Robb, M. A.; Cheeseman, J. R.; Montgomery, J. A., Jr.; Vreven, T.; Kudin, K. N.; Burant, J. C.; Millam, J. M.; Iyengar, S. S.; Tomasi, J.; Barone, V.; Mennucci, B.; Cossi, M.; Scalmani, G.; Rega, N.; Petersson, G. A.; Nakatsuji, H.; Hada, M.; Ehara, M.; Toyota, K.; Fukuda, R.; Hasegawa, J.; Ishida, M.; Nakajima, T.; Honda, Y.; Kitao, O.; Nakai, H.; Klene, M.; Li, X.; Knox, J. E.; Hratchian, H. P.; Cross, J. B.; Adamo, C.; Jaramillo, J.; Gomperts, R.; Stratmann, R. E.; Yazyev, O.; Austin, A. J.; Cammi, R.; Pomelli, C.; Ochterski, J. W.; Ayala, P. Y.; Morokuma, K.; Voth, G. A.; Salvador, P.; Dannenberg, J. J.; Zakrzewski, V. G.; Dapprich, S.; Daniels, A. D.; Strain, M. C.; Farkas, O.; Malick, D. K.; Rabuck, A. D.; Raghavachari, K.; Foresman, J. B.; Ortiz, J. V.; Cui, Q.; Baboul, A. G.; Clifford, S.; Cioslowski, J.; Stefanov, B. B.; Liu, G.; Liashenko, A.; Piskorz, P.; Komaromi, I.; Martin, R. L.; Fox, D. J.; Keith, T.; Al-Laham, M. A.; Peng, C. Y.; Nanayakkara, A.; Challacombe, M.; Gill, P. M. W.; Johnson, B.; Chen, W.; Wong, M. W.; Gonzalez, C.; Pople, J. A.; Gaussian, Inc.: Wallingford Conn., 2004.
12. Urban, J.; Schreiner, P. R.; Vacek, G.; Schleyer, P.; Huang, J. Q.; Leszczynski J. *Chem. Phys. Lett.* 1997, 264, 441.
13. Albinsson, B.; Teramae, H.; Plitt, H. S.; Goss, L. M.; Schmidbaur, H.; Michl, J. *J. Phys. Chem.* 1996, 100, 8681.
14. Jasinski, J. M.; Becerra, R.; Walsh, R. *Chem. Rev.* 1995, 95, 1203.
15. Cullis, A. G.; Robbins, D. J.; Pidduck A. J.; Smith, P. W. J. Cryst. Growth 1992, 123, 333.

We claim:

1. A compound comprising a silicon-germanium hydride selected from the group consisting of
   $(H_3Ge)_2(SiH_2)_2$; and
   $(GeH_3)_2SiH(SiH_3)$.

2. The compound of claim 1 wherein the silicon germanium hydride is substantially isolated $(H_3Ge)_2(SiH_2)_2$.

3. The compound of claim 2, further comprising $(GeH_3)_2(SiH_2GeH_2)$.

4. The compound of claim 1 wherein the silicon germanium hydride comprises $(H_3Ge)_2(SiH_2)_2$ and $(GeH_3)_2SiH(SiH_3)$.

5. A composition, comprising one or more compounds according to claim 1 in an inert gas.

6. The composition of claim 5, wherein the inert gas is selected from the group consisting of $H_2$, He, $N_2$, and argon.

7. A method of synthesizing one or more of the silicon-germanium hydrides of claim 1, comprising combining a perfluoroalkyl-sulfonate-substituted disilane with a compound comprising a $GeH_3$ ligand under conditions whereby the silicon-germanium hydride is formed.

8. The method of claim 7 wherein the compound comprising a $GeH_3$ ligand is selected from the group consisting of alkali and alkaline earth germanides.

9. The method of claim 7 wherein the method comprises combining the compound comprising a $GeH_3$ ligand with a nonafluorobutane-sulfonic substituted disilane, and wherein the nonafluorobutane-sulfonic substituted disilane comprises $(SO_3C_4F_9)_2(SiH_2)_2$.

10. The method of claim 7 wherein the method comprises combining the compound comprising a $GeH_3$ ligand with a triflate substituted disilane, and wherein the triflate substituted disilane comprises $(SO_3CF_3)_2(SiH_2)_2$.

11. The method of claim 10, wherein the compound comprising a $GeH_3$ ligand is $KGeH_3$, and wherein the silicon germanium hydride is formed according to the equation $$(SO_3CF_3)_2(SiH_2)_2 + 2KGeH_3 \rightarrow (H_3Ge)_2(SiH_2)_2 + 2KSO_3CF_3.$$

12. The method of claim 11, wherein the method comprises
   (a) adding $(CF_3SO_3)_2(SiH_2)_2$ to a slurry of $KGeH_3$ in solvent at between −40° C. and −20° C. to form a mixture;
   (b) warming the mixture to between 0° C. and 35° C.;
   (c) stirring the mixture under nitrogen; and
   (d) distilling the mixture to form the $(H_3Ge)_2(SiH_2)_2$.

13. The method of claim 12 wherein the reaction is carried out at a temperature of −10° C. or less.

14. The method of claim 12 wherein the reaction is carried out at a temperature of 22° C. or higher.

15. The method of claim 7, wherein the compound comprising a $GeH_3$ ligand is $KGeH_3$, and wherein the silicon germanium hydride is formed according to the equation $$(SO_3C_4F_9)_2(SiH_2)_2 + 2KGeH_3 \rightarrow (H_3Ge)_2(SiH_2)_2 + 2KSO_3C_4F_9.$$

16. The method of claim 15, wherein the method comprises
(a) adding $(C_4F_9SO_3)_2(SiH_2)_2$ to a slurry of $KGeH_3$ in solvent at between −50° C. and −30° C. to form a mixture;
(b) warming the mixture to between −20° C. and 0° C.;
(c) stirring the mixture under nitrogen;
(d) heating the mixture to between 25° C. and 45° C.; and
(e) distilling the mixture to form the $(H_3Ge)_2(SiH_2)_2$.

17. A method for depositing a Si—Ge material on a substrate in a reaction chamber, comprising introducing into the chamber a gaseous precursor comprising the compound of claim 1, under conditions whereby a layer comprising a Si—Ge material is formed on the substrate.

18. The method of claim 17 wherein the step of introducing the gaseous precursor comprises introducing the gaseous precursor in substantially pure form.

19. The method of claim 17 wherein the step of introducing the gaseous precursor comprises introducing the gaseous precursor as a single gas source.

20. The method of claim 17 wherein the step of introducing the gaseous precursor comprises introducing the gaseous precursor intermixed with an inert carrier gas.

21. The method of claim 20 wherein the inert carrier gas comprises $H_2$.

22. The method of claim 20 wherein the inert carrier gas comprises $N_2$.

23. The method of claim 17 wherein the gaseous precursor is deposited by gas source molecular beam epitaxy.

24. The method of claim 17 wherein the gaseous precursor is deposited by chemical vapor deposition.

25. The method of claim 17 wherein the gaseous precursor is introduced at a temperature of between 300° C. and 450° C.

26. The method of claim 17 wherein the gaseous precursor is introduced at a partial pressure between $10^{-8}$ Torr and 1000 Torr.

27. The method of claim 17 wherein the Si—Ge material is formed on the substrate as a strain-relaxed or uniformly strained layer having a planar surface.

28. The method of claim 17 wherein the composition of the Si—Ge material is substantially uniform.

29. The method of claim 17 wherein the entire Si and Ge framework of the gaseous precursor is incorporated into the Si—Ge material or epitaxial Si—Ge.

30. The method of claim 17 wherein the gaseous precursor is deposited by plasma enhanced chemical vapor deposition.

31. The method of claim 17 wherein the gaseous precursor is deposited by laser assisted chemical vapor deposition.

32. The method of claim 17 wherein the gaseous precursor is deposited by atomic layer deposition.

33. The method of claim 17 wherein the gaseous precursor comprises $(H_3Ge)_2(SiH_2)_2$.

34. The method of claim 17, wherein the substrate comprises germanium, silicon on insulator, Ge:Sn alloys, $SiO_2$, sapphire, quartz, Si:Ge alloys, Si:C alloys, stainless steel, and polyimide films.

35. The method of claim 34, wherein the substrate comprises silicon.

36. A method for depositing an epitaxial Si—Ge layer on a substrate, comprising
introducing near a surface of the substrate a gaseous precursor comprising the compound of claim 1; and
dehydrogenating the precursor under conditions whereby epitaxial Si—Ge is formed on the substrate.

37. The method of claim 36 wherein the step of introducing the gaseous precursor comprises introducing the gaseous precursor in substantially pure form.

38. The method of claim 36 wherein the step of introducing the gaseous precursor comprises introducing the gaseous precursor as a single gas source.

39. The method of claim 36 wherein the step of introducing the gaseous precursor comprises introducing the gaseous precursor intermixed with an inert carrier gas.

40. The method of claim 39 wherein the inert carrier gas comprises $H_2$.

41. The method of claim 39 wherein the inert carrier gas comprises $N_2$.

42. The method of claim 36 wherein the gaseous precursor is deposited by gas source molecular beam epitaxy.

43. The method of claim 36 wherein the gaseous precursor is deposited by chemical vapor deposition.

44. The method of claim 36 wherein the gaseous precursor is introduced at a temperature of between 300° C. and 450° C.

45. The method of claim 36 wherein the gaseous precursor is introduced at a partial pressure between $10^{-8}$ Torr and 1000 Torr.

46. The method of claim 36 wherein the Si—Ge material is formed on the substrate as a strain-relaxed or uniformly strained layer having a planar surface.

47. The method of claim 36 wherein the composition of the Si—Ge material is substantially uniform.

48. The method of claim 36 wherein the entire Si and Ge framework of the gaseous precursor is incorporated into the Si—Ge material or epitaxial Si—Ge.

49. The method of claim 36 wherein the gaseous precursor is deposited by plasma enhanced chemical vapor deposition.

50. The method of claim 36 wherein the gaseous precursor is deposited by laser assisted chemical vapor deposition.

51. The method of claim 36 wherein the gaseous precursor is deposited by atomic layer deposition.

52. The method of claim 36 wherein the gaseous precursor comprises $(H_3Ge)_2(SiH_2)_2$.

53. The method of claim 36, wherein the substrate comprises germanium, silicon on insulator, Ge:Sn alloys, $SiO_2$, sapphire, quartz, Si:Ge alloys, Si:C alloys, stainless steel, and polyimide films.

54. A compound comprising $(SO_3C_4F_9)_2(SiH_2)_2$.

55. A method for synthesizing $(SO_3C_4F_9)_2(SiH_2)_2$ comprising combining $R(SiH_2)_2$ and $HSO_3C_4F_9$ under conditions whereby the $(SO_3C_4F_9)_2(SiH_2)_2$ is formed, where R is an aryl substituent such as p-tolyl or benzyl.

56. A method for synthesizing $(SO_3C_4F_9)_2(SiH_2)_2$ comprising combining $(p\text{-tolyl})_2(SiH_2)_2$ and $HSO_3C_4F_9$ under conditions whereby the $(SO_3C_4F_9)_2(SiH_2)_2$ is formed.

57. The method of claim 56, wherein the $(SO_3C_4F_9)_2(SiH_2)_2$ is formed according to the equation $$(p\text{-tolyl})_2(SiH_2)_2 + 2HSO_3C_4F_9 \rightarrow (SO_3C_4F_9)_2(SiH_2)_2 + 2(\text{toluene}).$$

58. The method of claim 56 wherein the method comprises
(a) combining $HSO_3C_4F_9$, $(p\text{-tolyl})_2(SiH_2)_2$, and solvent in a reaction chamber at between −50° C. and 0° C. to form a mixture;
(b) warming the mixture to between 20° C. and 25° C.;
(c) stirring the mixture; and
(d) filtering the solid $(SO_3C_4F_9)_2(SiH_2)_2$.

\* \* \* \* \*